(12) United States Patent
Kori et al.

(10) Patent No.: US 11,934,100 B2
(45) Date of Patent: Mar. 19, 2024

(54) COMPOSITION FOR FORMING SILICON-CONTAINING RESIST UNDERLAYER FILM AND PATTERNING PROCESS

(71) Applicant: SHIN-ETSU CHEMICAL CO., LTD., Tokyo (JP)

(72) Inventors: Daisuke Kori, Joetsu (JP); Yusuke Kai, Joetsu (JP); Kazunori Maeda, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 80 days.

(21) Appl. No.: 17/532,653

(22) Filed: Nov. 22, 2021

(65) Prior Publication Data

US 2022/0179317 A1     Jun. 9, 2022

(30) Foreign Application Priority Data

Dec. 7, 2020  (JP) .................. 2020-202636

(51) Int. Cl.
*G03F 7/075* (2006.01)
*G03F 7/16* (2006.01)
*G03F 7/20* (2006.01)
*G03F 7/32* (2006.01)
*G03F 7/38* (2006.01)
*G03F 7/40* (2006.01)

(52) U.S. Cl.
CPC ........... *G03F 7/0757* (2013.01); *G03F 7/162* (2013.01); *G03F 7/2006* (2013.01); *G03F 7/322* (2013.01); *G03F 7/38* (2013.01); *G03F 7/40* (2013.01)

(58) Field of Classification Search
CPC ........ G03F 7/0757; G03F 7/0752; G03F 7/11; G03F 7/094; G03F 7/075
See application file for complete search history.

(56) References Cited

U.S. PATENT DOCUMENTS

| | | | | |
|---|---|---|---|---|
| 7,153,636 B1 * | 12/2006 | Ludemann | ......... | G03C 1/49872 430/536 |
| 7,374,856 B2 * | 5/2008 | Suwa | ........ | C08K 5/42 430/192 |
| 7,425,399 B2 * | 9/2008 | Kishioka | ........ | G03F 7/038 544/221 |
| 8,048,968 B2 * | 11/2011 | Phelan | ........ | C08F 293/00 526/263 |
| 2009/0136869 A1 | 5/2009 | Ogihara et al. | | |
| 2010/0133518 A1 * | 6/2010 | Maeda | ........ | H10K 10/471 257/40 |
| 2012/0052685 A1 | 3/2012 | Ogihara et al. | | |
| 2012/0282776 A1 | 11/2012 | Kim et al. | | |
| 2012/0315765 A1 | 12/2012 | Nakajima et al. | | |
| 2013/0210236 A1 | 8/2013 | Ogihara et al. | | |

(Continued)

FOREIGN PATENT DOCUMENTS

| | | |
|---|---|---|
| EP | 2 538 276 A1 | 12/2012 |
| JP | 2007-199653 A | 8/2007 |
| JP | 2009-126940 A | 6/2009 |
| JP | 2012-053253 A | 3/2012 |
| JP | 2013032327 A * | 2/2013 |
| JP | 2013-167669 A | 8/2013 |

(Continued)

OTHER PUBLICATIONS

May 16, 2022 Extended Search Report issued in European Patent Application No. 21210373.3.

*Primary Examiner* — Mark F. Huff
*Assistant Examiner* — Alexander Nicholas Lee
(74) *Attorney, Agent, or Firm* — Oliff PLC

(57) ABSTRACT

A composition for forming a silicon-containing resist underlayer film contains a compound shown by the following general formula (A-1) and a thermally crosslinkable polysiloxane. $R_1$ represents a methyl group, an ethyl group, a propyl group, an allyl group, or a propargyl group. $R_2$ represents a hydrogen atom, an acetyl group, an acryloyl group, a methacryloyl group, a benzoyl group, a naphthoyl group, or an anthranoyl group. $R_3$ represents a methyl group, an ethyl group, a propyl group, an allyl group, a propargyl group, or a group shown by the following general formula (A-2), where a broken line represents a bonding arm, and $R_1$ and $R_2$ are as defined above. An object of the present invention is to provide a silicon-containing resist underlayer film capable of exhibiting high effect of suppressing ultrafine pattern collapse and forming a resist pattern with favorable pattern profile in multilayer resist methods.

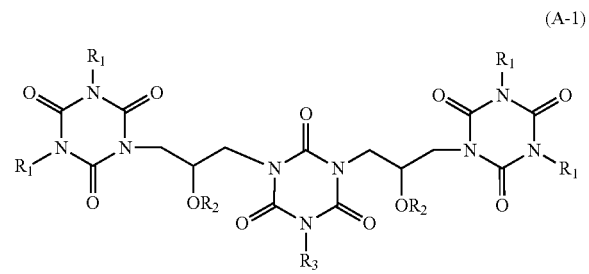

(A-1)

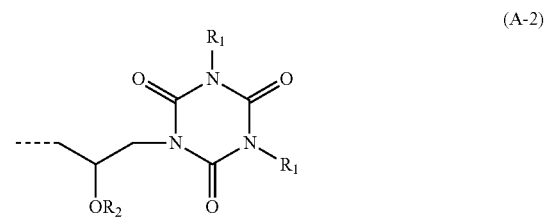

(A-2)

20 Claims, No Drawings

(56) References Cited

U.S. PATENT DOCUMENTS

| | | | |
|---|---|---|---|
| 2013/0280912 A1 | 10/2013 | Ogihara et al. | |
| 2016/0053087 A1 | 2/2016 | Ogihara et al. | |
| 2019/0235383 A1* | 8/2019 | Inari | G03F 7/0757 |
| 2019/0265593 A1 | 8/2019 | Shibayama et al. | |
| 2020/0233303 A1 | 7/2020 | Ogihara et al. | |

FOREIGN PATENT DOCUMENTS

| | | |
|---|---|---|
| JP | 2013-224279 A | 10/2013 |
| JP | 2020-118960 A | 8/2020 |
| KR | 101590608 B1 * | 2/2016 |
| WO | 2020/085508 A1 | 4/2020 |
| WO | 2020/196563 A1 | 10/2020 |

* cited by examiner

COMPOSITION FOR FORMING SILICON-CONTAINING RESIST UNDERLAYER FILM AND PATTERNING PROCESS

TECHNICAL FIELD

The present invention relates to a composition for forming a silicon-containing resist underlayer film, and a patterning process using the composition.

BACKGROUND ART

As Large-Scale Integrated circuits (LSIs) advance toward higher integration and higher processing speed, miniaturization of pattern size is rapidly progressing. Along with this miniaturization, the lithography technology has achieved formation of fine patterns by shortening the wavelength of a light source and by selecting a proper resist composition corresponding to the shortened wavelength. The main factor of this achievement is a positive photoresist composition used as a monolayer. This monolayer positive photoresist composition allows a resist resin to have not only a skeleton that possesses etching resistance against dry etching with chlorine- or fluorine-based gas plasma, but also a switching mechanism that makes an exposed part soluble. Thereby, after a pattern is formed by dissolving the exposed part, a substrate to be processed is dry-etched using the remaining resist pattern as an etching mask.

However, if the miniaturization is pursued, that is, if the pattern width is reduced, without changing the film thickness of a photoresist film to be used, the resolution of the photoresist film decreases. In addition, if the photoresist film is pattern-developed by using a developer, what is called an aspect ratio thereof becomes so large that a problem of the pattern collapse occurs. For these reasons, the thickness of the photoresist film has been reduced in accordance with the pattern miniaturization.

On the other hand, a substrate to be processed has been generally processed by dry etching using a pattern-formed photoresist film as an etching mask. In practice, however, there is no dry etching method capable of providing an absolute etching selectivity between the photoresist film and the substrate to be processed. Thus, there have been problems that the resist film is also damaged and collapses during the substrate processing, and the resist pattern cannot be precisely transferred to the substrate to be processed. Accordingly, higher dry etching resistance has been required in a photoresist composition along with the pattern miniaturization. Meanwhile, a resin used for the photoresist composition has been required to have low absorption at the wavelength of the exposure light in order to enhance the resolution. The resin used for the photoresist composition thus has been shifted to a novolak resin, polyhydroxystyrene, and a resin having an aliphatic polycyclic skeleton as the exposure light is shifted to i-line, KrF, and ArF, which have shorter wavelengths. This shift actually accelerates the etching rate under dry etching condition for processing the substrate, and recent photoresist compositions having high resolution tend to have rather low etching resistance.

In such circumstances, a substrate to be processed has to be dry-etched with a thinner photoresist film having lower etching resistance. A material and a process reliably employed in this patterning process are urgently needed.

A multilayer resist method is one of solutions for these problems. In this method, an underlayer film having a different etching selectivity from that of a photoresist film (i.e., resist upper layer film) is placed between the resist upper layer film and a substrate to be processed; a pattern is formed in the resist upper layer film; then, the pattern is transferred to the underlayer film by dry etching using the resist upper layer film pattern as a dry etching mask; and the pattern is further transferred to the substrate to be processed by dry etching using the underlayer film as a dry etching mask.

One of the multilayer resist methods is a three-layer resist method which can be performed using a resist composition generally adopted in a monolayer resist method. In this three-layer resist method, for example, an organic film made of a novolak resin or the like is formed on a substrate to be processed, a silicon-containing resist underlayer film is formed on the organic film, and further a usual organic photoresist film is formed as a resist upper layer film on the silicon-containing resist underlayer film. When dry etching is performed with fluorine-based gas plasma, such an organic resist upper layer film can have a good etching selectivity ratio relative to the silicon-containing resist underlayer film, so that the resist upper layer film pattern can be transferred to the silicon-containing resist underlayer film by dry etching with fluorine-based gas plasma. According to this method, even if a resist composition to be used has difficulty in forming a pattern with a sufficient film thickness to directly process the substrate to be processed or does not have sufficient dry etching resistance to process the substrate, the pattern can be transferred to the silicon-containing film (resist underlayer film); next, pattern transfer by dry etching with oxygen- or hydrogen-based gas plasma gives the pattern in the organic film made of a novolak resin or the like having sufficient dry etching resistance to process the substrate. After this organic film pattern is formed, the remaining silicon-containing resist underlayer film is removed generally by dry etching with fluorine-based gas plasma or wet etching with, for example, alkali- or fluorine-based etching solution to eliminate the defect-causing residue. If the etching rate is insufficient, this increases a possibility that the residue derived from the silicon-containing resist underlayer film stays and causes defect, or that longer etching treatment is required, bringing about problems such as damaging the substrate to be processed. As described above, for precise patterning and smooth removal, the silicon-containing resist underlayer film needs to be etched at appropriate speed.

Meanwhile, the recent advents of ArF immersion lithography, EUV lithography, and so forth start to realize finer pattern formations. On the other hand, ultrafine patterns have such small contact areas that the patterns quite easily collapse. Suppressing such pattern collapse in addition to improving pattern profile is enormous challenge. Hence, the development of a silicon-containing resist underlayer film having a high effect of suppressing pattern collapse is urgently required.

To remedy pattern collapse, there have been proposed compositions for forming a silicon-containing resist underlayer film for ArF or EUV lithography; in each composition, a substituent having effects such as adhesiveness and heat-curing catalyst function is introduced to a side chain structure of a siloxane structure (Patent Documents 1, 2). Introducing these improves the effect of suppressing pattern collapse. However, pattern collapse is still major problem in the latest application of further advanced miniaturization by employing EUV lithography or the like.

CITATION LIST

Patent Literature

Patent Document 1: WO 2020/085508 A1
Patent Document 2: WO 2020/196563 A1

SUMMARY OF INVENTION

Technical Problem

An object of the present invention is to provide a silicon-containing resist underlayer film capable of exhibiting high effect of suppressing ultrafine pattern collapse and forming a resist pattern with favorable pattern profile in multilayer resist methods.

Solution to Problem

To achieve the object, the present invention provides a composition for forming a silicon-containing resist underlayer film, comprising:
  a compound shown by the following general formula (A-1); and
  a thermally crosslinkable polysiloxane,

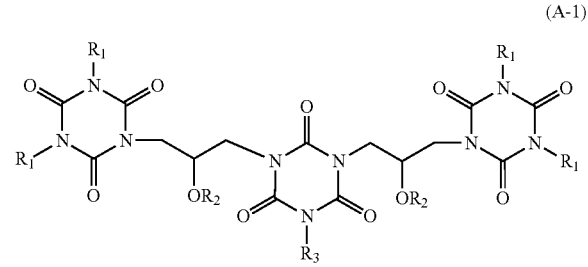
(A-1)

wherein $R_1$ represents a methyl group, an ethyl group, a propyl group, an allyl group, or a propargyl group; $R_2$ represents a hydrogen atom, an acetyl group, an acryloyl group, a methacryloyl group, a benzoyl group, a naphthoyl group, or an anthranoyl group; and $R_3$ represents a methyl group, an ethyl group, a propyl group, an allyl group, a propargyl group, or a group shown by the following general formula (A-2),

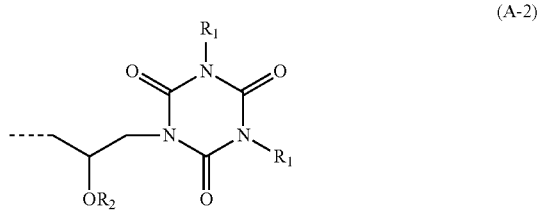
(A-2)

wherein a broken line represents a bonding arm; and $R_1$ and $R_2$ are as defined above.

In a lithography step using an ultraviolet laser such as ArF or EUV employed in semiconductor-device manufacturing processes, the use of a silicon-containing resist underlayer film formed from the inventive composition containing the compound having an isocyanuric acid structure shown by the general formula (A-1) successfully results in favorable adhesiveness to a photoresist pattern formed on the silicon-containing resist underlayer film.

The thermally crosslinkable polysiloxane preferably comprises any one or more of a repeating unit shown by the following general formula (Sx-1), a repeating unit shown by the following general formula (Sx-2), and a partial structure shown by the following general formula (Sx-3),

(Sx-1)

(Sx-2)

(Sx-3)

wherein $R^4$, $R^5$, and $R^6$ are identical to or different from one another, and each represent a monovalent organic group having 1 to 30 carbon atoms.

When the thermally crosslinkable polysiloxane (Sx) has a certain structure(s) as described above, the effects of the present invention are more sufficiently exhibited.

The inventive composition preferably further comprises an acid generator.

Adding an acid generator as necessary allows fine adjustment of pattern profile, exposure sensitivity, etc.

The acid generator is preferably a sulfonium salt which is a photoacid generator and generates an acid by an action of a high energy beam.

In this case, the pattern profile, exposure sensitivity, and so forth of a resist upper layer film can be appropriately adjusted while decreases in the other properties are suppressed to the minimum. Additionally, a residue derived from the resist upper layer film is effectively reduced in some cases.

The present invention also provides a patterning process for forming a pattern in a body to be processed, comprising steps of:
  forming an organic film by using a coating-type organic film material on a body to be processed;
  forming a silicon-containing resist underlayer film on the organic film by using the above-described composition for forming a silicon-containing resist underlayer film;
  forming a resist upper layer film on the silicon-containing resist underlayer film by using a resist upper layer film composition composed of a photoresist composition;
  forming a circuit pattern in the resist upper layer film;
  transferring the pattern to the silicon-containing resist underlayer film by etching while using the resist upper layer film having the formed circuit pattern as a mask;
  transferring the pattern to the organic film by etching while using the silicon-containing resist underlayer film having the transferred pattern as a mask; and
  transferring the pattern to the body to be processed by etching while using the organic film having the transferred pattern as a mask.

Moreover, the present invention provides a patterning process for forming a pattern in a body to be processed, comprising steps of:
forming a hard mask mainly containing carbon by a CVD method on a body to be processed;
forming a silicon-containing resist underlayer film on the hard mask by using the above-described composition for forming a silicon-containing resist underlayer film;
forming a resist upper layer film on the silicon-containing resist underlayer film by using a resist upper layer film composition composed of a photoresist composition;
forming a circuit pattern in the resist upper layer film;
transferring the pattern to the silicon-containing resist underlayer film by etching while using the resist upper layer film having the formed circuit pattern as a mask;
transferring the pattern to the hard mask by dry etching while using the silicon-containing resist underlayer film having the transferred pattern as a mask; and
transferring the pattern to the body to be processed by dry etching while using the hard mask having the transferred pattern as a mask.

These patterning processes suppress pattern collapse of the resist upper layer film and can provide a favorable resist pattern. Moreover, a pattern is favorably transferred to the silicon-containing resist underlayer film by dry etching. Further, after the patterning, the remaining silicon-containing resist underlayer film is easily removed, so that the residue hardly generates defect. Accordingly, the patterning processes are particularly practical for forming fine patterns.

In the step of forming a circuit pattern in the resist upper layer film, the pattern is preferably formed by a photolithography with a wavelength of 10 nm or more and 300 nm or less, a direct drawing with electron beam, nanoimprinting, or a combination thereof.

When a pattern is formed in the resist upper layer film by a certain patterning method as described above, the effects of the present invention are more sufficiently exhibited.

The body to be processed is preferably a semiconductor device substrate, a metal film, a metal carbide film, a metal oxide film, a metal nitride film, a metal oxycarbide film, or a metal oxynitride film.

When the body to be processed is a certain material as described above, the effects of the present invention are more sufficiently exhibited.

Further, the body to be processed preferably comprises a metal which is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

When the metal constituting the body to be processed is a certain metal as described above, the effects of the present invention are more sufficiently exhibited.

Advantageous Effects of Invention

The inventive composition for forming a silicon-containing resist underlayer film contains a compound having multiple isocyanuric acid structures, and a silicon-containing resist underlayer film obtained by using the inventive composition makes it possible to form not only an ultrafine upper layer resist pattern without collapse but also favorable pattern profile. Moreover, the inventive composition allows formation of a semiconductor-device pattern on a substrate with high yield because of excellent dry etching selectivity relative to a resist upper layer film and an organic film or hard mask. Further, a silicon-containing resist underlayer film using the inventive composition for forming a silicon-containing resist underlayer film has high etching selectivity relative to an organic material, so that a photoresist pattern to be formed can be successively transferred from the silicon-containing resist underlayer film to an organic film or hard mask by dry etching process. Furthermore, the silicon-containing resist underlayer film formed according to the present invention is etched at sufficient rate, so that it is easy to remove the remaining silicon-containing resist underlayer film after the patterning is ended, and defect due to such residue hardly occurs. Thus, the present invention is particularly useful for forming fine patterns.

DESCRIPTION OF EMBODIMENTS

The present invention relates to: a composition for forming a coating-type silicon-containing film used in lithography in processes of manufacturing semiconductor devices and the like; and a patterning process using the composition.

As described above, there have been demands for: a composition for forming a silicon-containing resist underlayer film in multilayer resist methods, the silicon-containing resist underlayer film having high effect of suppressing collapse of ultrafine patterns and appropriate etching rate, and enabling favorable resist pattern formation; and an ultrafine-patterning process using the composition.

The present inventors have earnestly studied to achieve the above object and consequently found that blending a compound having a particular isocyanuric acid structure into a composition for forming a silicon-containing resist underlayer film results in a silicon-containing resist underlayer film capable of suppressing ultrafine pattern collapse and forming favorable resist pattern in multilayer resist methods, and having appropriate etching rate in the processing. This finding has led to the completion of the present invention.

Specifically, the present invention is a composition for forming a silicon-containing resist underlayer film, comprising:
a compound shown by the following general formula (A-1); and
a thermally crosslinkable polysiloxane,

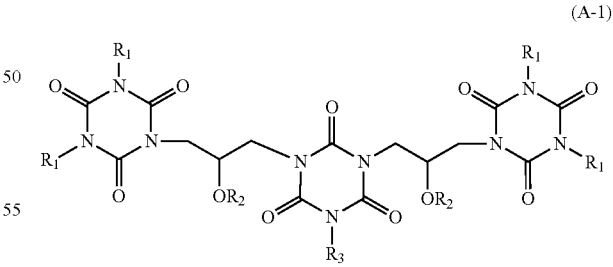

wherein $R_1$ represents a methyl group, an ethyl group, a propyl group, an allyl group, or a propargyl group; $R_2$ represents a hydrogen atom, an acetyl group, an acryloyl group, a methacryloyl group, a benzoyl group, a naphthoyl group, or an anthranoyl group; and $R_3$ represents a methyl group, an ethyl group, a propyl group, an allyl group, a propargyl group, or a group shown by the following general formula (A-2),

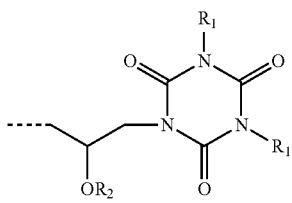

(A-2)

wherein a broken line represents a bonding arm; and $R_1$ and $R_2$ are as defined above.

Hereinafter, the present invention will be described in detail, but the present invention is not limited thereto.

<Composition for Forming Silicon-Containing Resist Underlayer Film>

The inventive composition for forming a silicon-containing resist underlayer film is characterized by containing a compound shown by the following general formula (A-1) and a thermally crosslinkable polysiloxane.

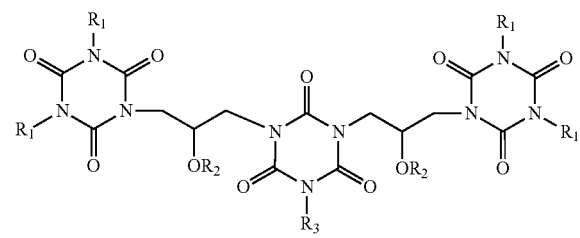

(A-1)

Each $R_1$ represents a methyl group, an ethyl group, a propyl group, an allyl group, or a propargyl group. Each $R_2$ represents a hydrogen atom, an acetyl group, an acryloyl group, a methacryloyl group, a benzoyl group, a naphthoyl group, or an anthranoyl group. $R_3$ represents a methyl group, an ethyl group, a propyl group, an allyl group, a propargyl group, or a group shown by the following general formula (A-2).

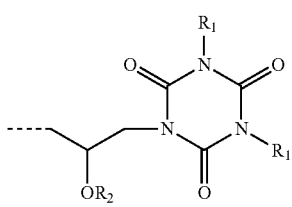

(A-2)

A broken line represents a bonding arm. $R_1$ and $R_2$ are as defined above.

[Compound Shown by General Formula (A-1)]

The compound shown by the general formula (A-1) can be exemplified by the following, for example. $R_3$ is as defined above.

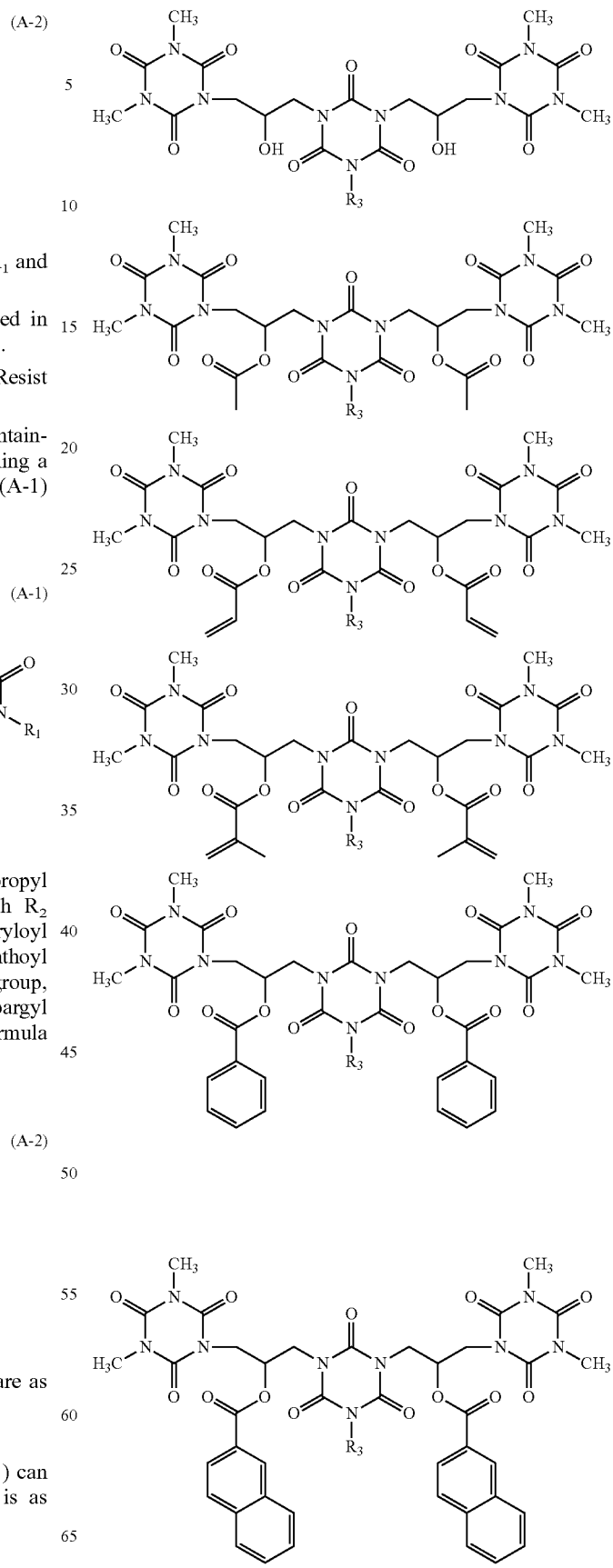

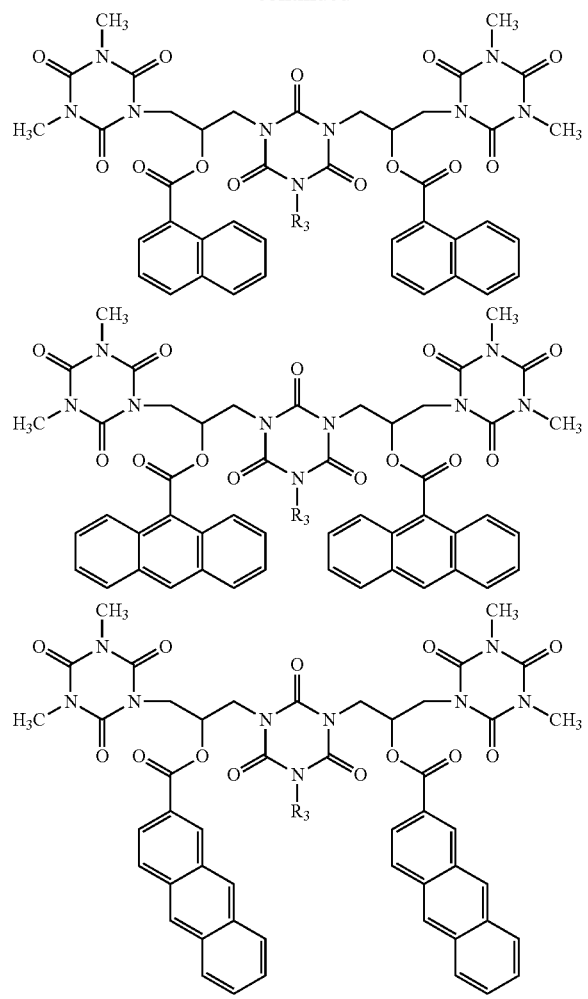
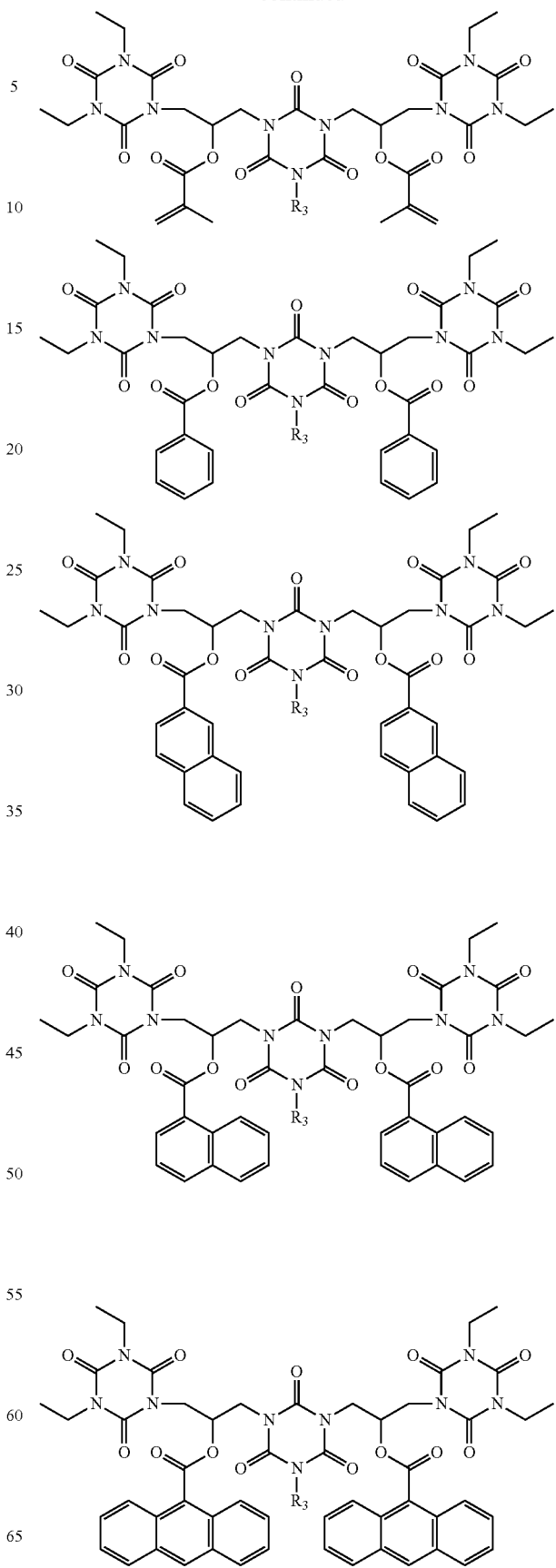

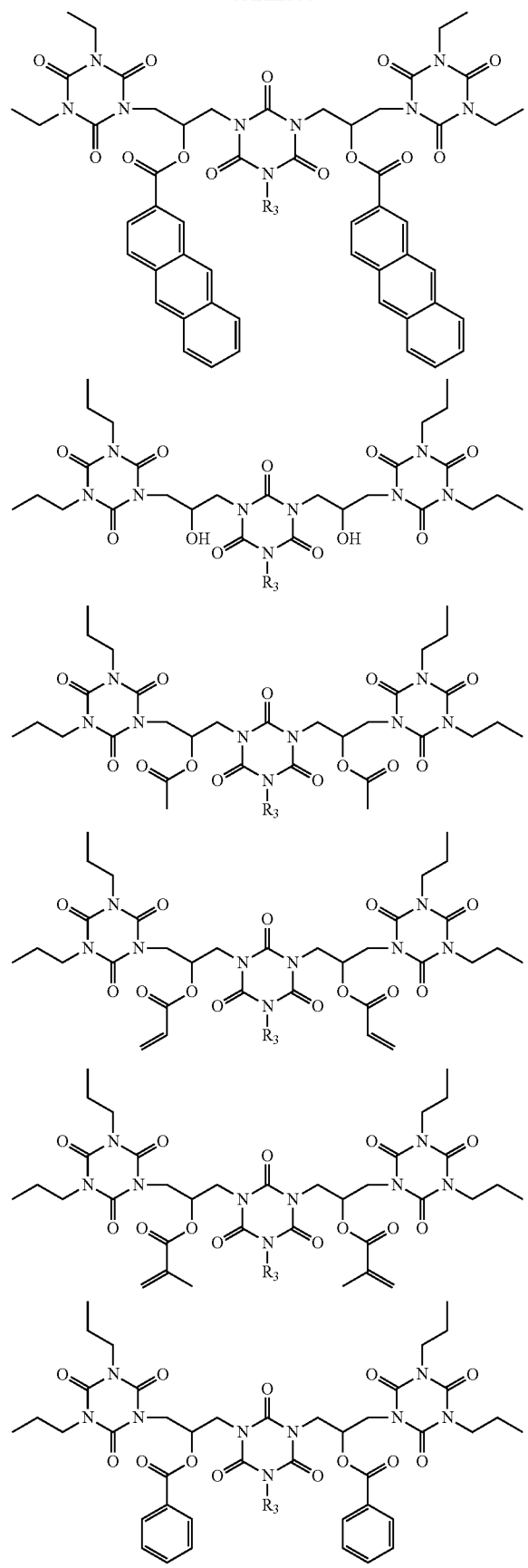
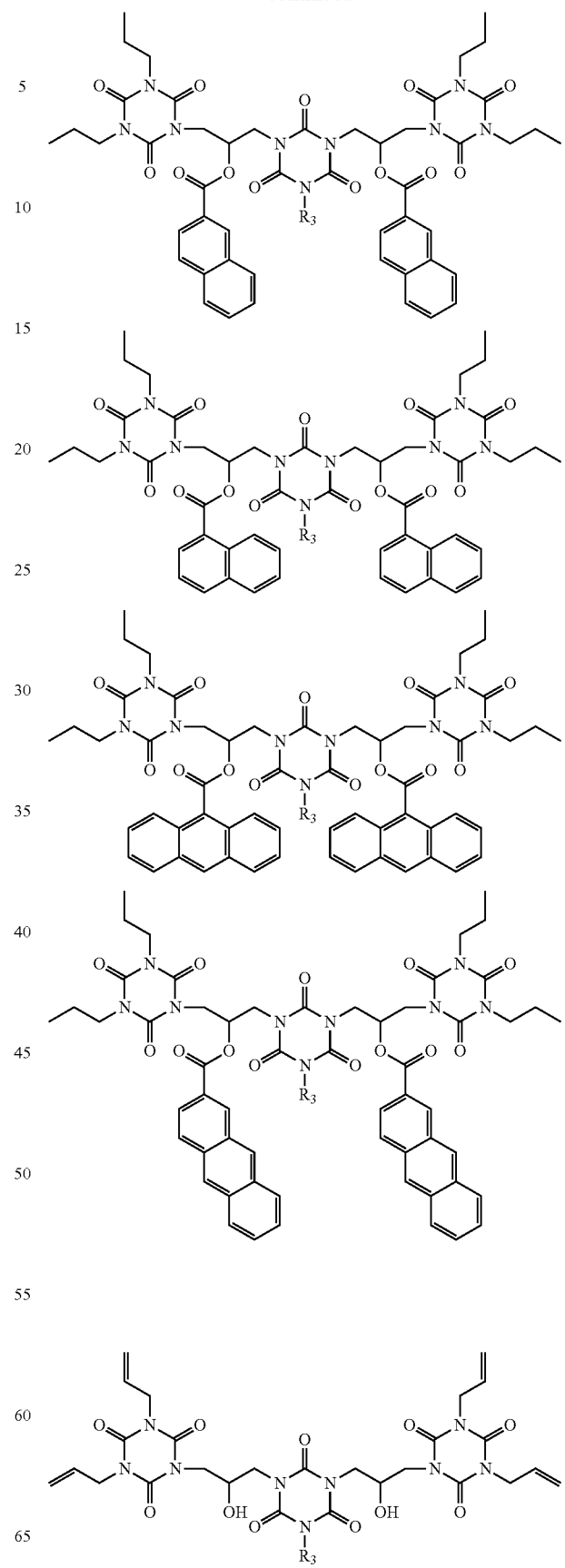

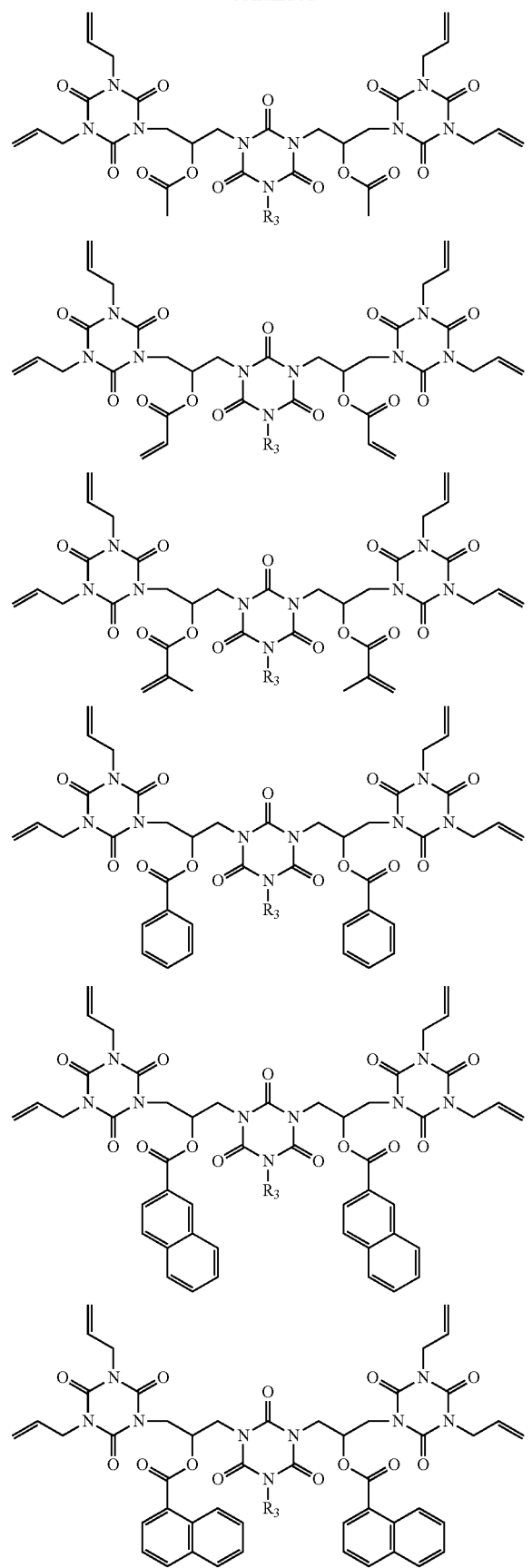
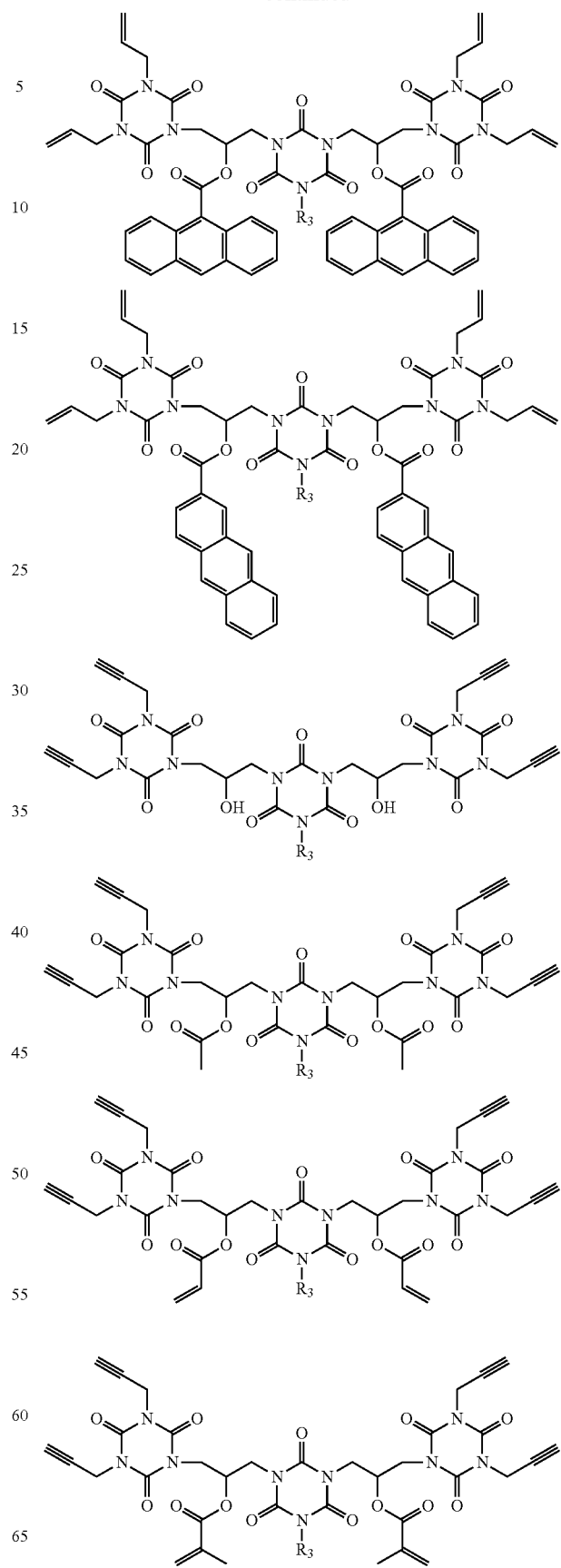

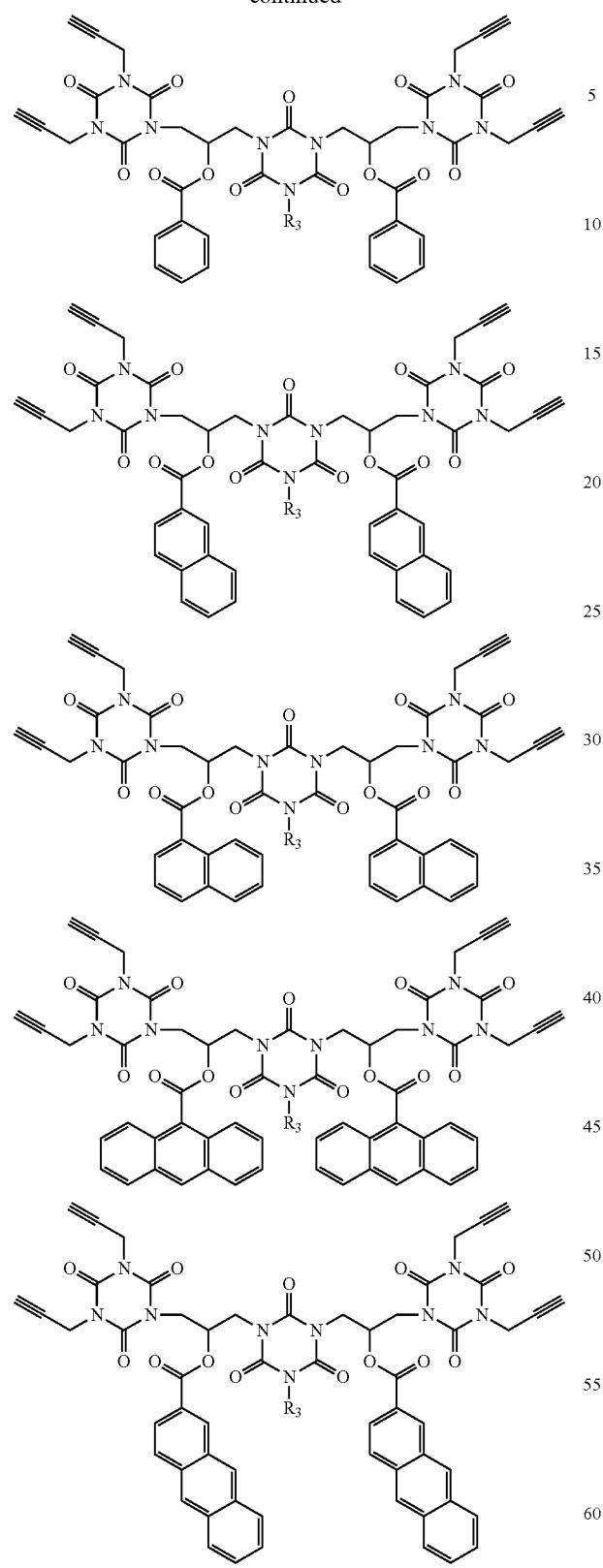
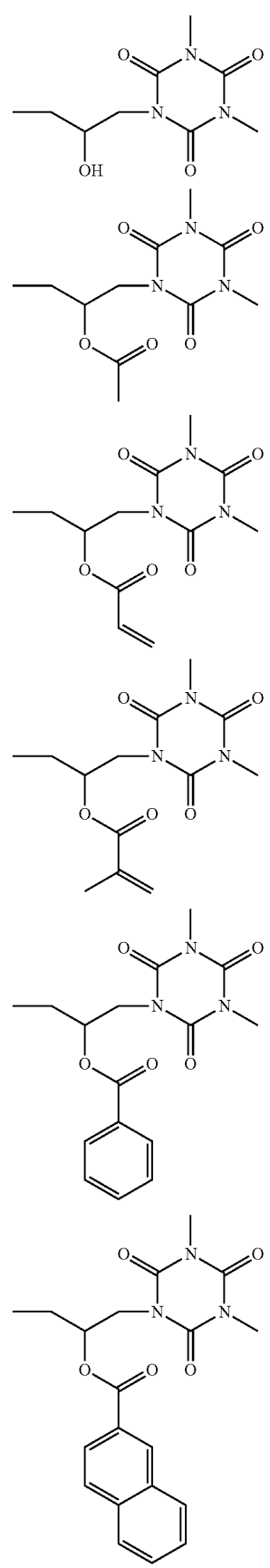
The structure shown by the general formula (A-2) can be exemplified by the following, for example.

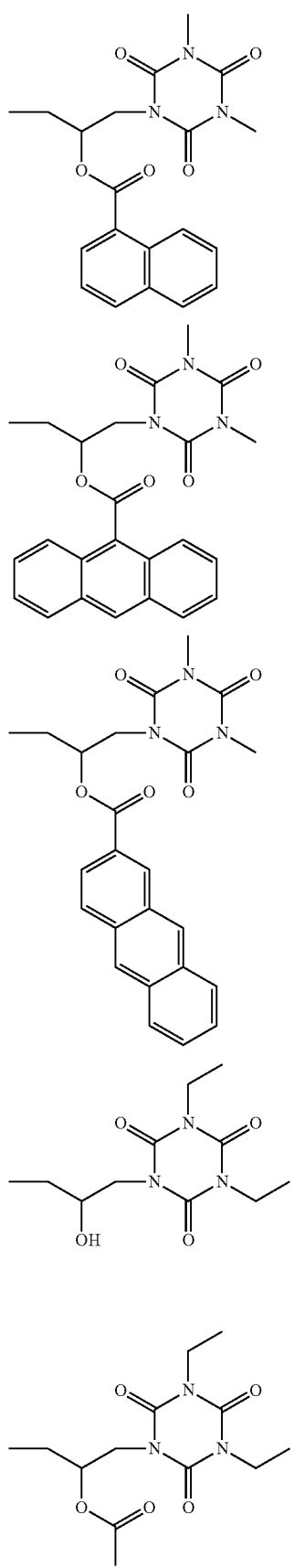
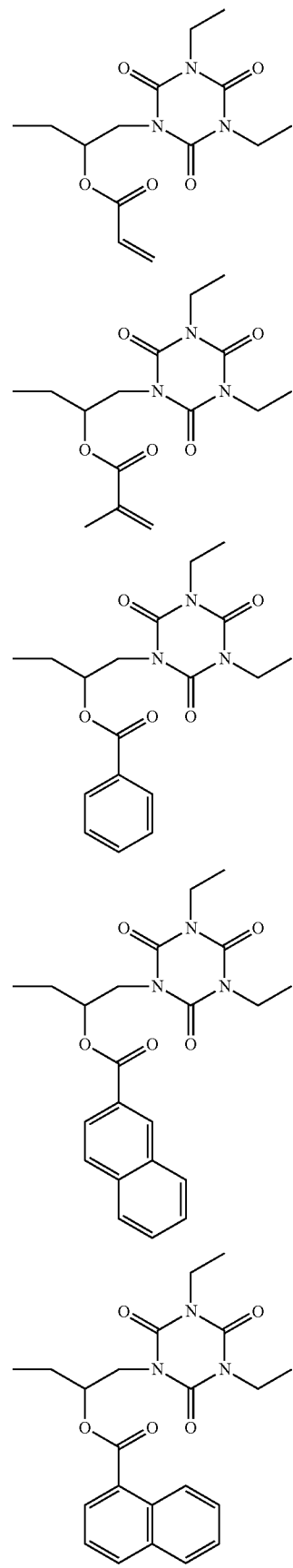

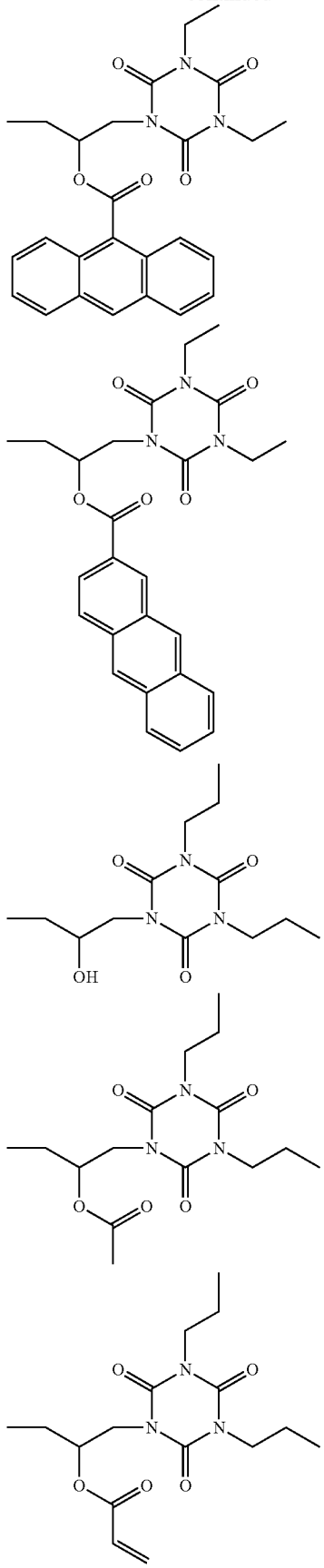
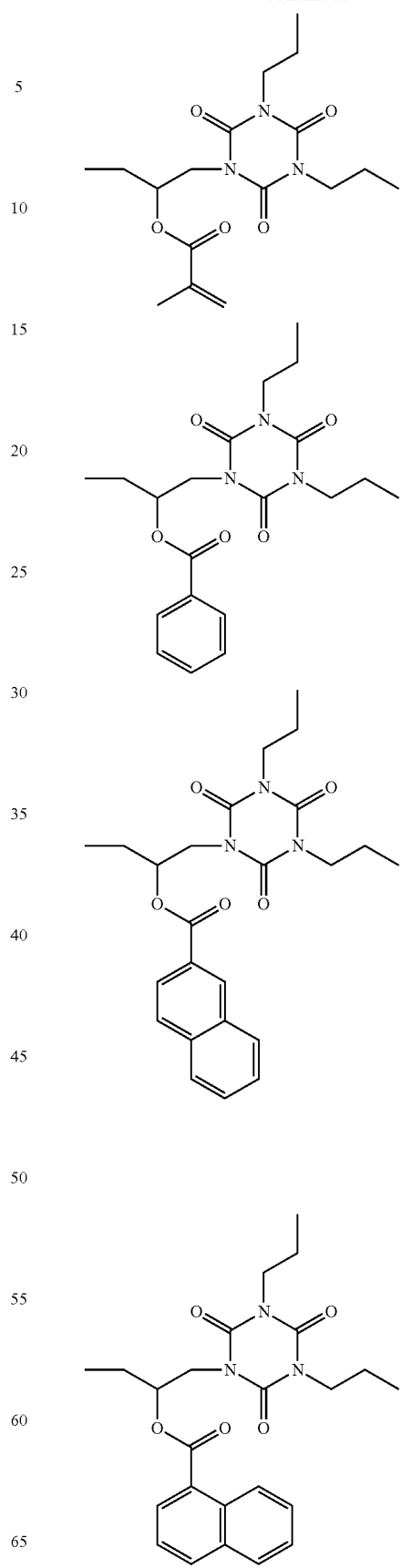

21
-continued
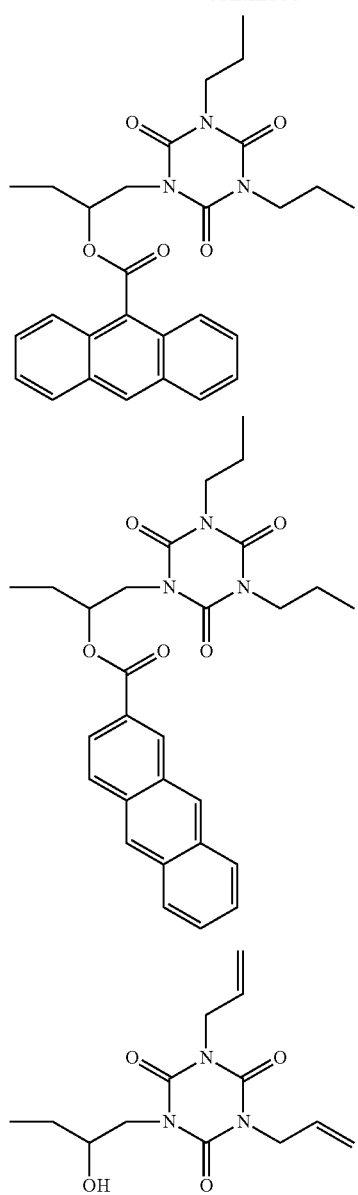
22
-continued
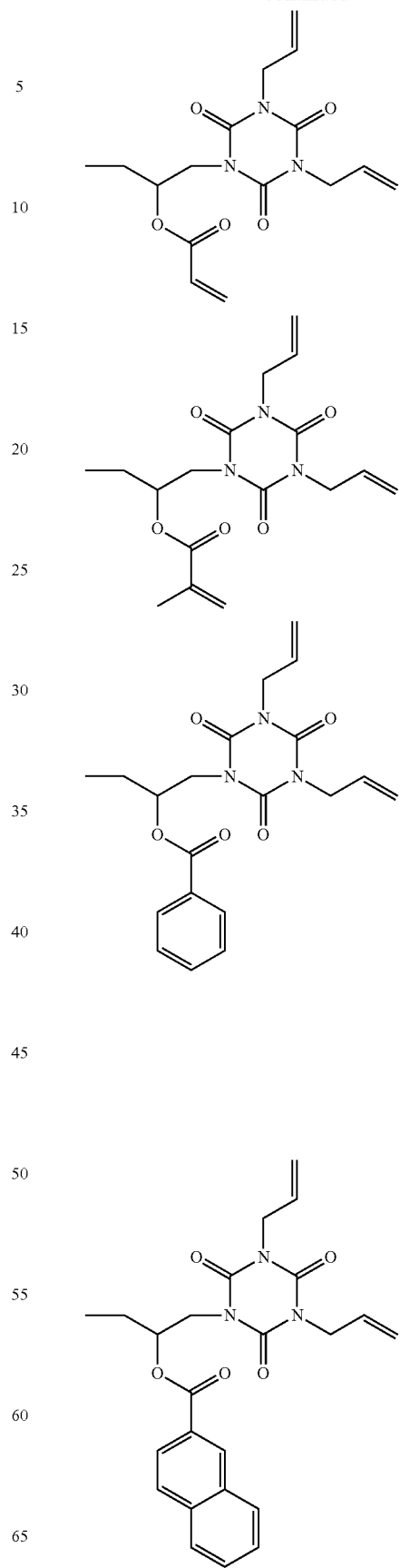

23
-continued
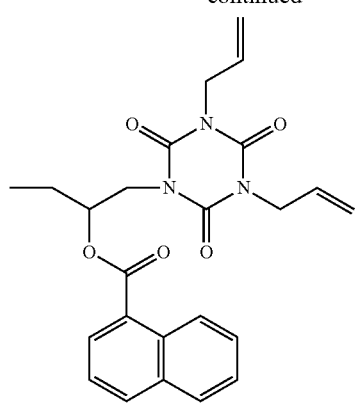
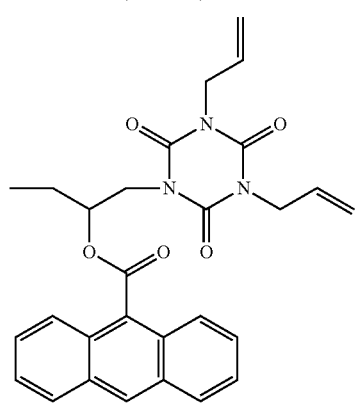
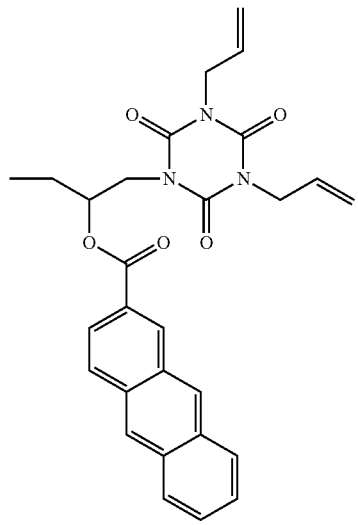
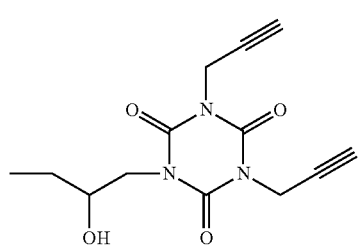
24
-continued
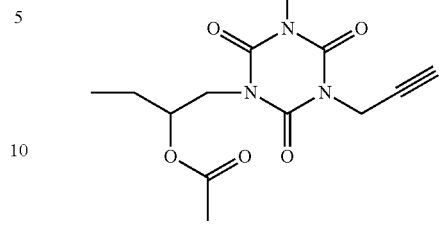
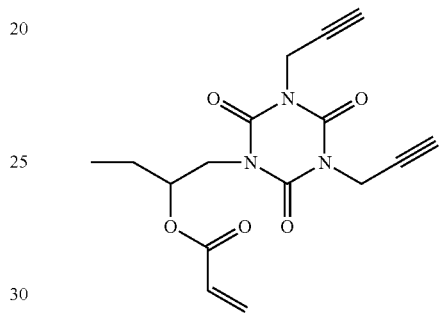
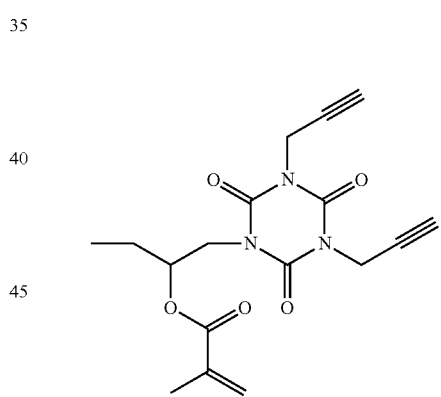
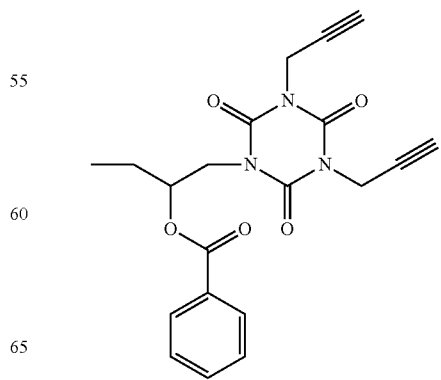

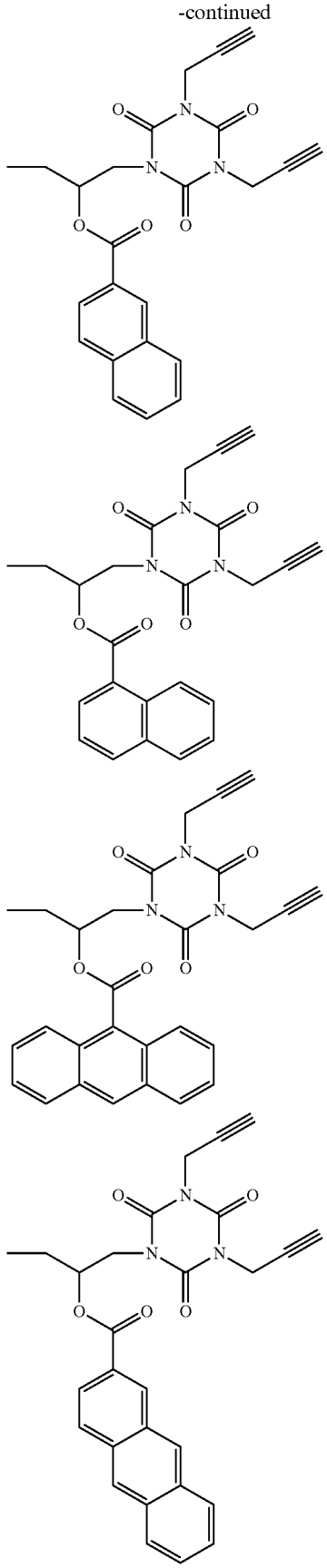

Preferable examples of the compound shown by the general formula (A-1) include the following etc. To be more specific, preferably, $R_1$ is an allyl group or a propargyl group, $R_2$ is a hydrogen atom, an acetyl group, or an acryl group, and $R_3$ is an allyl group or a group shown by the general formula (A-2). Further preferably, $R_1$ is an allyl group or a propargyl group, $R_2$ is a hydrogen atom or an acetyl group, and $R_3$ is an allyl group.

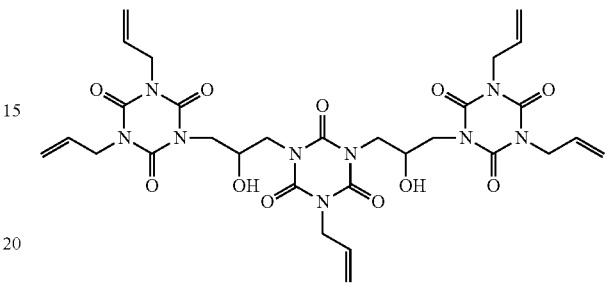

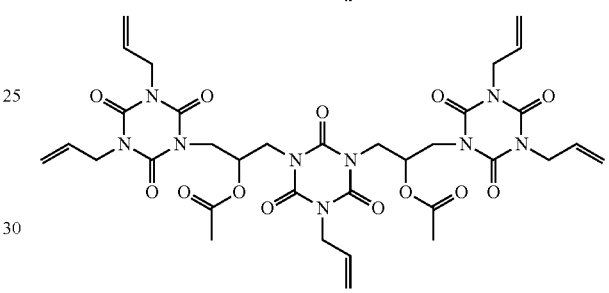

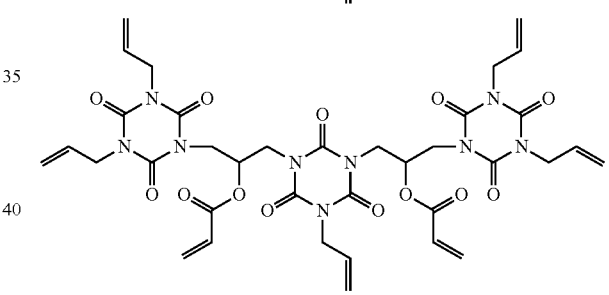

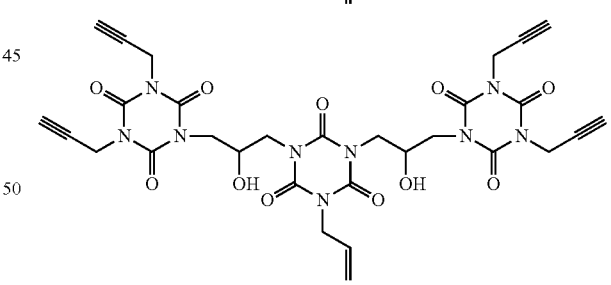

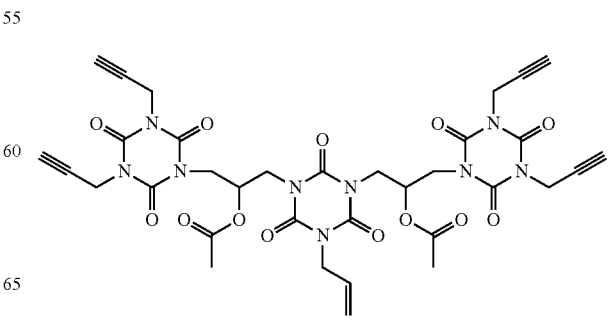

-continued

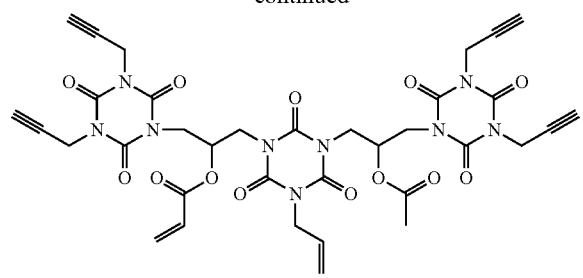
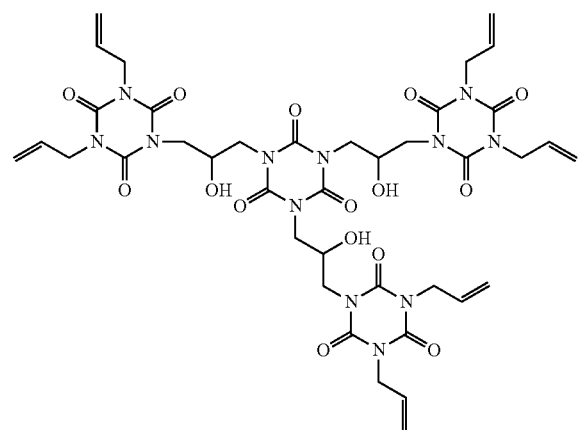
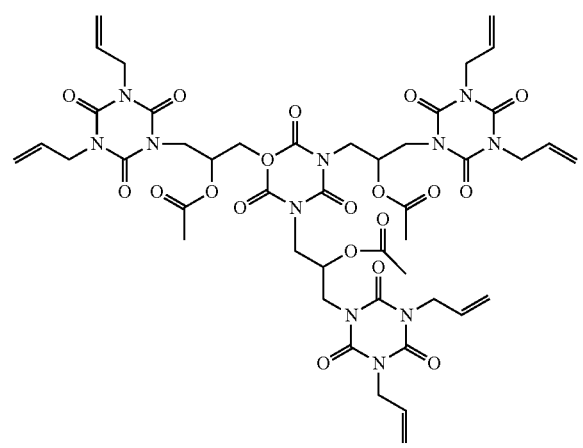
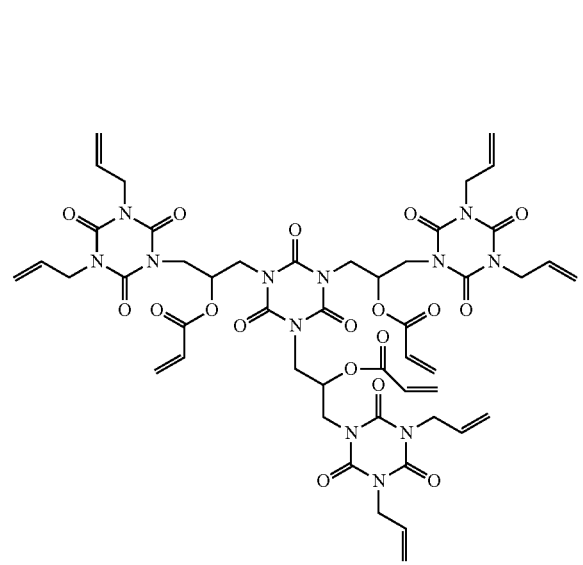

-continued

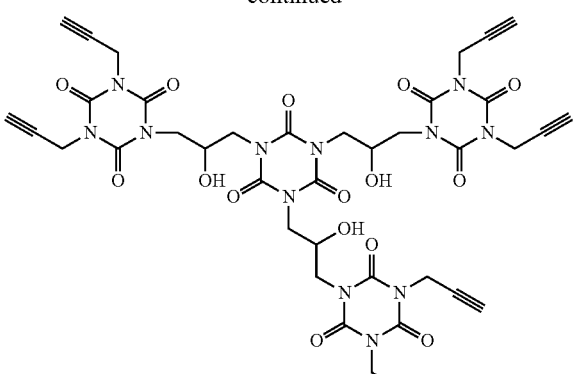

[Method for Synthesizing Compound Shown by General Formula (A-1)]

The means for obtaining the compound shown by the general formula (A-1) used in the present invention is not particularly limited. As illustrated by the following reaction equations, the compound can be obtained by addition reaction between an epoxy compound and an isocyanuric acid derivative (STEP 1-1); in a case where $R_2$ is not a hydrogen atom, the addition reaction is followed by acylation (STEP 1-2). Note that, in a case where $R_3$ is (A-2), the compound of the general formula (A-1) can be obtained through similar reactions (STEP 2-1, STEP 2-2), in which a trifunctional epoxy compound is used as the epoxy compound. In the following equations, $R_1$, $R_2$, and $R_3$ are as defined above.

STEP 1-1

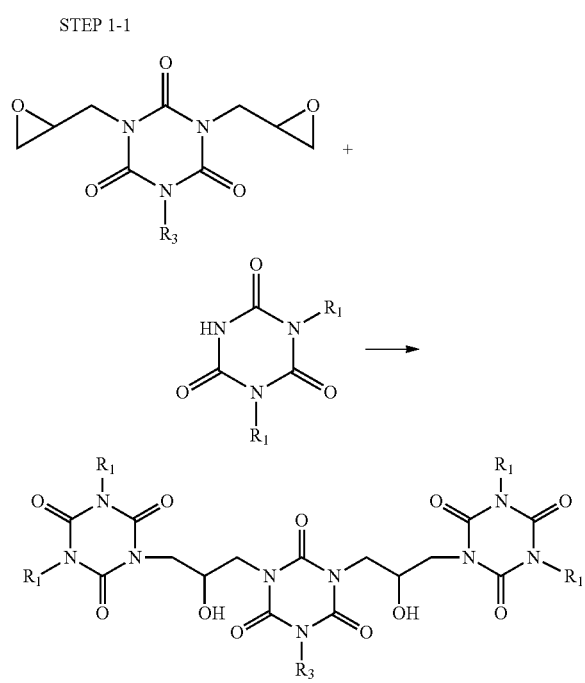

STEP 1-2

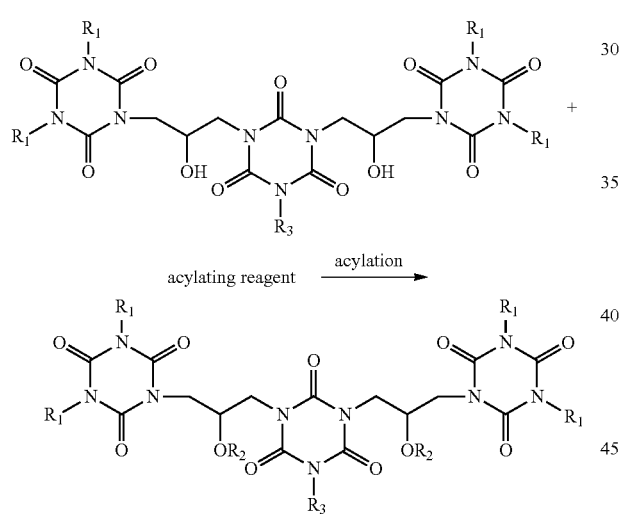

STEP 2-1

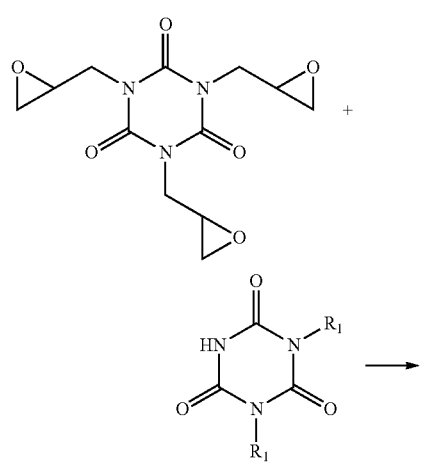

-continued

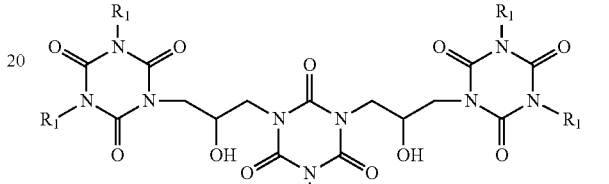

STEP 2-2

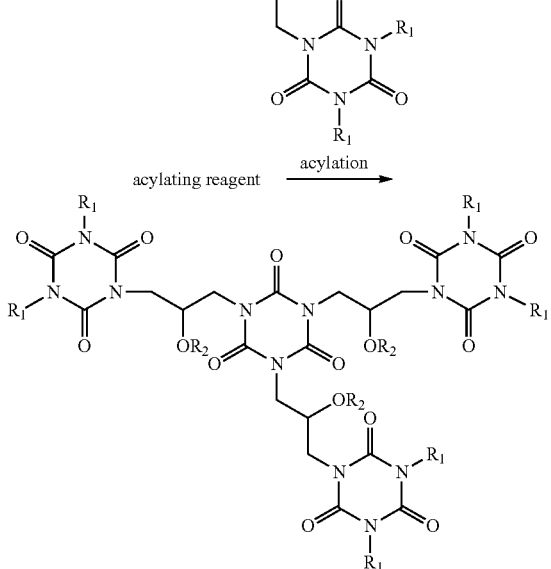

In the reaction shown by STEP 1-1 or STEP 2-1 between an epoxy compound and an isocyanuric acid derivative, the isocyanuric acid derivative is charged in an amount of preferably 0.3 to 2.0 mol, more preferably 0.5 to 1.5 mol, further preferably 0.75 to 1.25 mol, per mol of the epoxy group in the epoxy compound.

When the amount of the isocyanuric acid derivative charged is sufficient relative to the epoxy unit, no unreacted epoxy group remains, and the storage stability will not be affected. When the amount of the isocyanuric acid derivative charged is not excessive relative to the epoxy unit, no unreacted isocyanuric acid derivative remains, and outgassing is prevented.

The compound synthesized from raw materials as described above can be obtained generally by reaction between the epoxy compound and the isocyanuric acid derivative in a solvent alone or in a solvent in the presence of a reaction catalyst, at room temperature or as necessary under cooling or heating.

Examples of the solvent to be used include alcohols, such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers, such as diethyl ether, dibutyl ether, diethylene glycol diethyl ether, diethylene glycol dimethyl ether, tetrahydrofuran, and 1,4-dioxane; chlorinated solvents, such as methylene chloride, chloroform, dichloroethane, and trichloroethylene; hydrocarbons, such as hexane, heptane, benzene, toluene, xylene, and cumene; nitriles, such as acetonitrile; ketones, such as acetone, ethyl methyl ketone, and isobutyl methyl ketone; esters, such as ethyl acetate, n-butyl acetate, and propylene glycol methyl ether acetate; lactones, such as γ-butyrolactone; and non-protic polar solvents, such as dimethylsulfoxide, N,N-dimethylformamide, and hexamethylphosphoric triamide. One of these or a mixture of two or more thereof can be used. These solvents can be used in an amount ranging from 0 to 2,000 parts by mass based on 100 parts by mass of the reaction raw materials.

Examples of the reaction catalyst include quaternary ammonium salts, such as benzyltriethylammonium chloride, benzyltriethylammonium bromide, benzyltrimethylammonium chloride, tetramethylammonium chloride, tetramethylammonium bromide, tetramethylammonium iodide, tetramethylammonium hydroxide, tetraethylammonium bromide, tetrabutylammonium chloride, tetrabutylammonium bromide, tetrabutylammonium iodide, tetrabutylammonium hydrogen sulfate, trioctylmethylammonium chloride, tributylbenzylammonium chloride, trimethylbenzylammonium chloride, trimethylbenzylammonium hydroxide, N-laurylpyridinium chloride, N-lauryl-4-picolinium chloride, N-laurylpicolinium chloride, trimethylphenylammonium bromide, and N-benzylpicolinium chloride; quaternary phosphonium salts, such as tetrabutylphosphonium chloride, tetrabutylphosphonium bromide, and tetraphenylphosphonium chloride; tertiary amines, such as tris[2-(2-methoxyethoxy)ethyl]amine, tris (3,6-dioxaheptyl)amine, and tris(3,6-dioxaoctyl)amine; etc. The amount of the catalyst to be used can be in a range of 0.001 to 100 weight %, preferably 0.005 to 50 weight %, with respect to the raw materials.

The reaction temperature is preferably about −50° C. to the boiling point of the solvent, more preferably room temperature to 150° C. The reaction time is appropriately selected within a range of 0.1 to 100 hours.

The reaction method include a method in which an epoxy compound, an isocyanuric acid derivative, and a catalyst are charged at once; a method in which an epoxy compound and an isocyanuric acid derivative are prepared into a form of dispersion or solution, and then a catalyst is added at once thereto or diluted with a solvent and added dropwise thereto; and a method in which a catalyst is prepared into a form of dispersion or solution, and then an epoxy compound and an isocyanuric acid derivative are added at once thereto or diluted with a solvent and added dropwise thereto. After completion of the reaction, the resultant may be directly used without purification etc., or may be diluted with an organic solvent and then subjected to liquid separation and washing to remove unreacted raw materials, the catalyst, and so forth present in the system, and to collect the reaction product.

The organic solvent used in this event is not particularly limited, as long as it is capable of dissolving the reaction product and being separated, when mixed with water, into two layers. Examples of the organic solvent include hydrocarbons, such as hexane, heptane, benzene, toluene, and xylene; esters, such as ethyl acetate, n-butyl acetate, and propylene glycol methyl ether acetate; ketones, such as methyl ethyl ketone, methyl amyl ketone, cyclohexanone, and methyl isobutyl ketone; ethers, such as diethyl ether, diisopropyl ether, methyl-tert-butyl ether, and ethylcyclopentylmethyl ether; chlorinated solvents, such as methylene chloride, chloroform, dichloroethane, and trichloroethylene; mixtures thereof; etc. As water used for washing in this event, generally, what is called deionized water or ultrapure water may be used. The washing may be performed at least once, preferably once to approximately five times, because washing ten times or more does not always produce the full washing effects thereof.

In the liquid separation and washing, washing with a basic aqueous solution may be performed to remove unreacted isocyanuric acid or acidic components. Examples of the base include hydroxides of alkaline metals, carbonates of alkaline metals, hydroxides of alkali earth metals, carbonates of alkali earth metals, ammonia, organic ammonium, etc.

Further, in the liquid separation and washing, washing with an acidic aqueous solution may be performed to remove metal impurities or basic components in the system. Examples of the acid include inorganic acids, such as hydrochloric acid, hydrobromic acid, sulfuric acid, nitric acid, phosphoric acid, and heteropoly acid; organic acids, such as oxalic acid, trifluoroacetic acid, methanesulfonic acid, benzenesulfonic acid, p-toluenesulfonic acid, and trifluoromethanesulfonic acid; etc.

The liquid separation and water washing may be performed together with any one of the basic aqueous solution and the acidic aqueous solution, or can be performed with a combination of the two. The liquid separation and water washing is preferably performed with the basic aqueous solution and the acidic aqueous solution in this order from the viewpoint of removing metal impurities.

After the liquid separation and water washing together with the basic aqueous solution and/or acidic aqueous solution, washing with neutral water may be successively performed. The washing may be performed at least once, preferably once to approximately five times. As the neutral water, deionized water, ultrapure water, or the like mentioned above may be used. The washing may be performed once or more, but if the washing is not performed sufficiently, basic and acidic components cannot be removed in some cases. The washing is preferably performed approximately once to five times because washing ten times or more does not always produce the full washing effects.

Further, after the liquid separation operation, the reaction product can also be collected as a powder by concentrating and drying the solvent or crystallizing the reaction product under reduced pressure or normal pressure. Alternatively, the reaction product can be retained in a solution state with an appropriate concentration to improve the workability in preparing the composition for forming a silicon-containing resist underlayer film. In this case, when the concentration is not too high, the viscosity is hardly high, and the workability is not impaired. When the concentration is not too low, the amount of a solvent to be used is not excessive, and the solution can be prepared economically. The concentration in this case is preferably 0.1 to 50 mass %, further preferably 0.5 to 30 weight %.

The solvent used in this event is not particularly limited, as long as it is capable of dissolving the obtained compound. Specific examples of the solvent include ketones, such as cyclohexanone and methyl-2-amyl ketone; alcohols, such as 3-methoxybutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. One of these or a mixture of two or more thereof can be used.

The reaction shown by STEP 1-2 or STEP 2-2 progresses easily by a known method. The acylating reagent is preferably an acid chloride or acid anhydride of acetic acid, acrylic acid, methacrylic acid, benzoic acid, 1-naphthalenecarboxylic acid, 2-naphthalenecarboxylic acid, 2-anthracenecarboxylic acid, 9-anthracenecarboxylic acid, etc. When an acid chloride is used, the compound obtained by STEP 1-1 or STEP 2-1, the acid chloride, and a base (such as triethylamine, pyridine, 4-dimethylaminopyridine) are sequentially or simultaneously mixed without a solvent or in a solvent (such as methylene chloride, acetonitrile, toluene, hexane), and as necessary cooled or heated, for example. Meanwhile, when an acid anhydride is used, the compound obtained by STEP 1-1 or STEP 2-1 and a base (such as triethylamine, pyridine, 4-dimethylaminopyridine) are sequentially or simultaneously added into a solvent (such as toluene), and as necessary cooled or heated, for example. The obtained reaction product can be collected as a powder or solution after purification operation, such as water washing. Examples of the solvent used for collecting the reaction product as a solution in this case include those exemplified above as the solvent used to collect a solution of the compound obtained by STEP 1-1 or STEP 2-1. The concentration in the case of STEP 1-2 or STEP 2-2 is preferably 0.1 to 50 mass %, further preferably 0.5 to 30 weight %.

Note that one kind of the compound shown by the general formula (A-1) used in the present invention can be used singly, or two or more kinds thereof can be used in combination. These compounds are added in an amount of preferably 0.01 to 40 parts by mass, more preferably 0.1 to 30 parts by mass, further preferably 1 to 20 parts by mass, based on 100 parts by mass of a base polymer (a thermally crosslinkable polysiloxane obtained by a method to be described later).

For example, a silicon-containing resist underlayer film using such a compound exhibits favorable adhesiveness to a photoresist pattern formed thereon, and also exhibits high etching selectivity relative to both of a resist pattern formed on the silicon-containing resist underlayer film and, for example, an organic film formed under the silicon-containing resist underlayer film. Accordingly, when a photoresist pattern to be formed is successively transferred to the silicon-containing resist underlayer film and to an organic underlayer film by using dry etching process, it is possible to transfer the pattern while keeping the favorable pattern profile. Thus, finally, the pattern formed in the upper layer resist can be transferred to a substrate with high precision.

[Thermally Crosslinkable Polysiloxane]

The inventive composition for forming a silicon-containing resist underlayer film contains a thermally crosslinkable polysiloxane (Sx) in addition to one or more kinds of the compound shown by the general formula (A-1).

The thermally crosslinkable polysiloxane (Sx) used in the present invention preferably contains any one or more of a repeating unit shown by the following general formula (Sx-1), a repeating unit shown by the following general formula (Sx-2), and a partial structure shown by the following general formula (Sx-3).

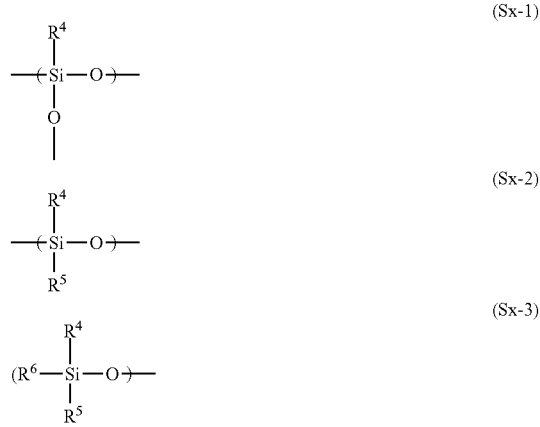

In the formulae, $R^4$, $R^5$, and $R^6$ are identical to or different from one another, and each represent a monovalent organic group having 1 to 30 carbon atoms.

The thermally crosslinkable polysiloxane (Sx) can be produced by hydrolysis condensation of the following hydrolysable monomer (Sm).

Specific examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, etc.

Preferable examples of the compound include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, etc.

Other examples of the organic group represented by $R^4$, $R^5$, and $R^6$, which correspond to the compounds exemplified above as the hydrolysable monomer (Sm), include organic groups having one or more carbon-oxygen single bonds or carbon-oxygen double bonds; specifically, organic groups having one or more functional groups selected from the group consisting of an ether group (bond), an ester group (bond), an alkoxy group, and a hydroxy group. Examples of the organic groups include ones as shown by the following general formula (Sm-R).

$$(P-Q_1-(S_1)_{v1}-Q_2-)_u-(T)_{v2}-Q_3-(S_2)_{v3}-Q_4-) \quad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms. $Q_1$, $Q_2$, $Q_3$, and $Q_4$ each independently represent $-C_qH_{(2q-p)}P_p-$. Here, P is as defined above, "p" represents an integer of 0 to 3, and "q" represents an integer of 0 to 10, provided that q=0 means a single bond. "u" represents an integer of 0 to 3. $S_1$ and $S_2$ each independently represent $-O-$, $-CO-$, $-OCO-$, $-COO-$, or $-OCOO-$. v1, v2, and v3 each independently represent 0 or 1. T represents a divalent atom other than carbon, or a divalent group of an alicyclic, aromatic, or heterocyclic ring. As T, examples of the alicyclic, aromatic, or heterocyclic ring optionally containing a hetero-atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

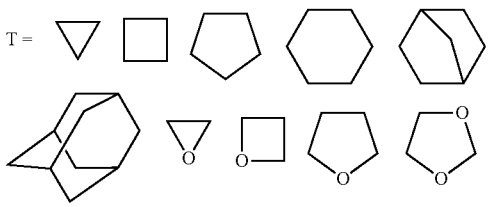

T =

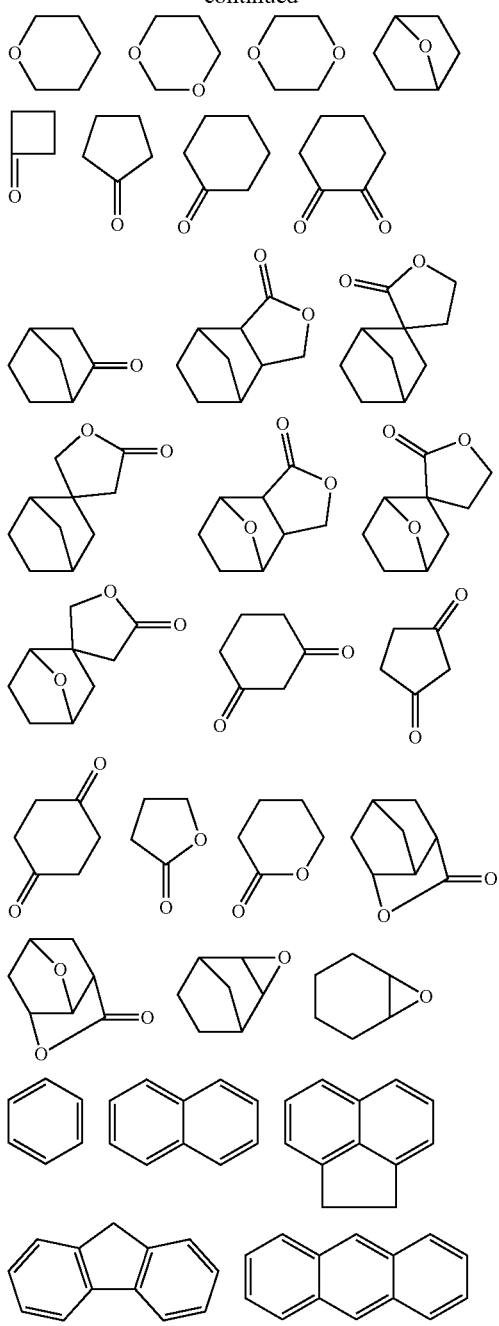
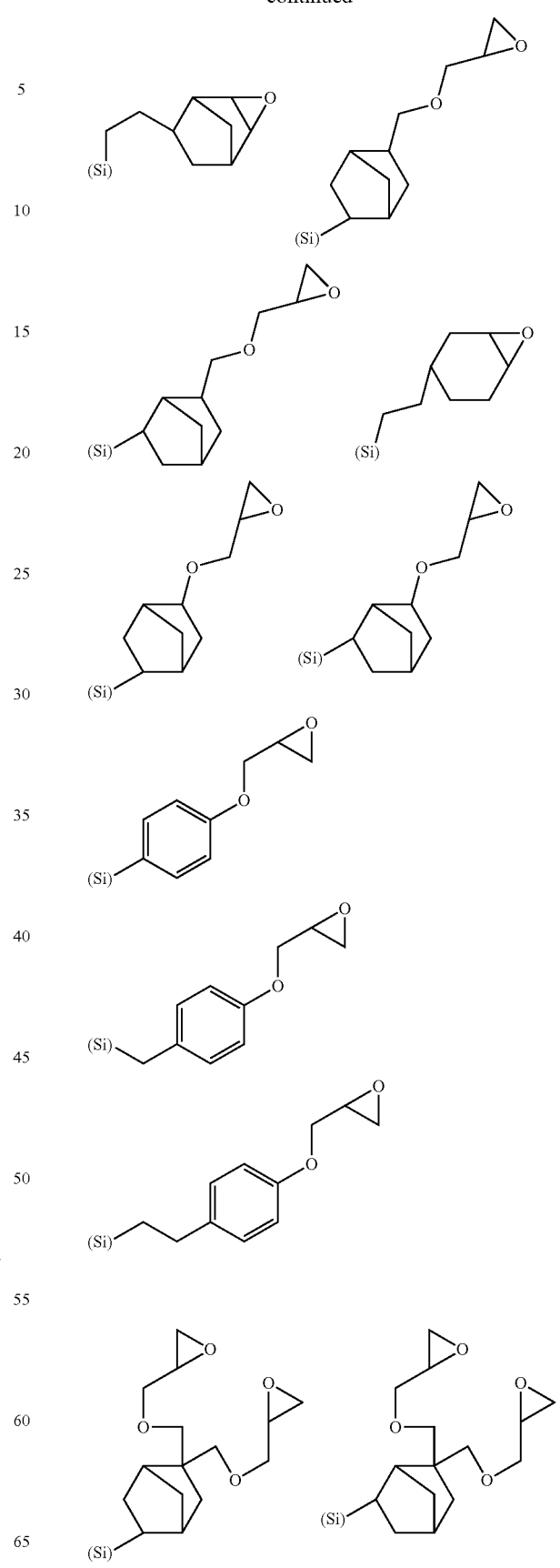
Preferable examples of the organic groups having one or more carbon-oxygen single bonds or carbon-oxygen double bonds in the general formula (Sm-R) include the following. Note that, in the following formulae, (Si) is depicted to show a bonding site to Si.
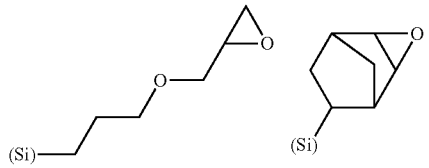

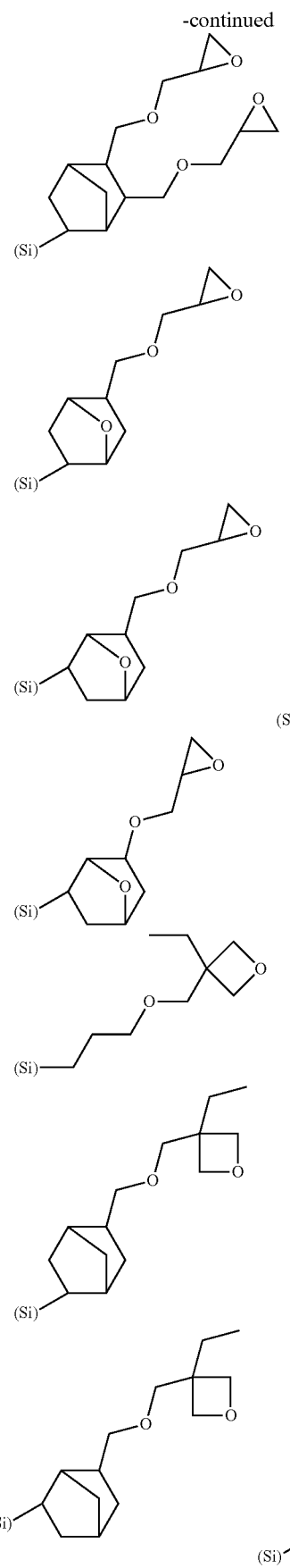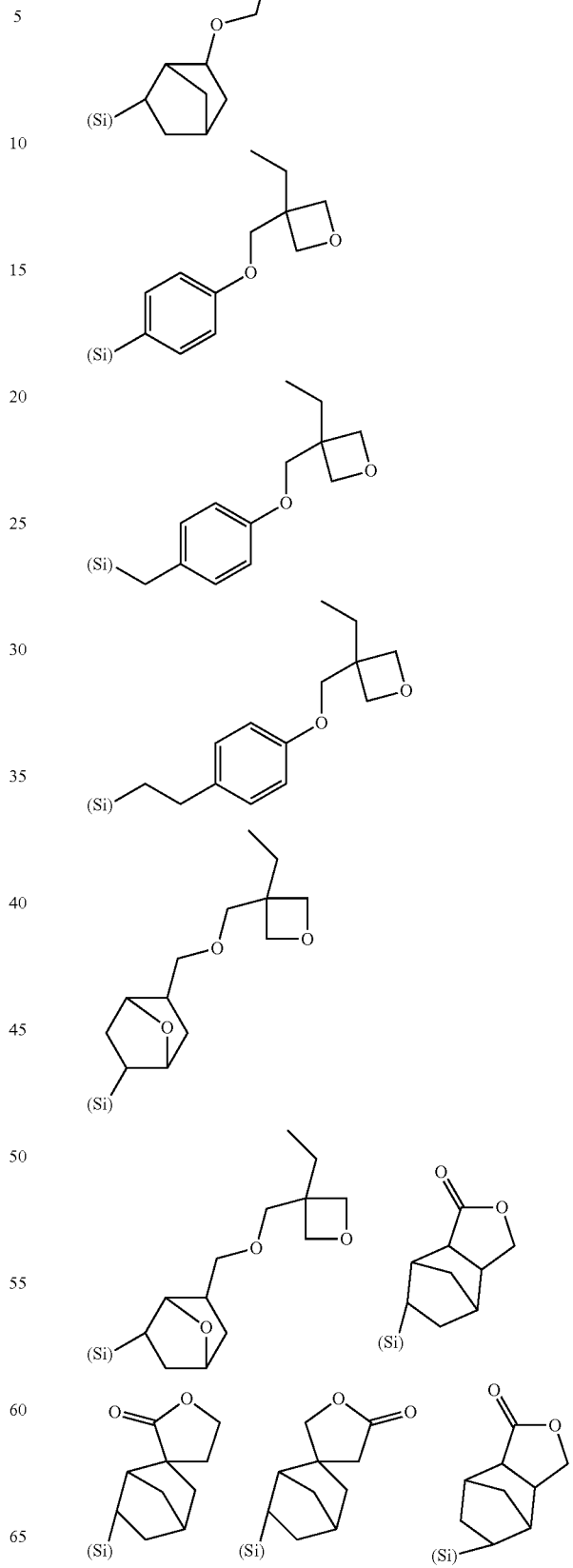

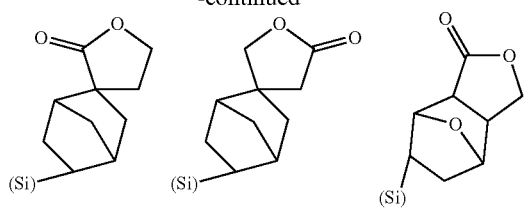
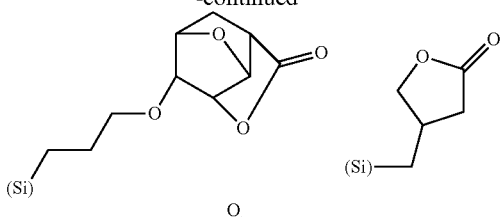

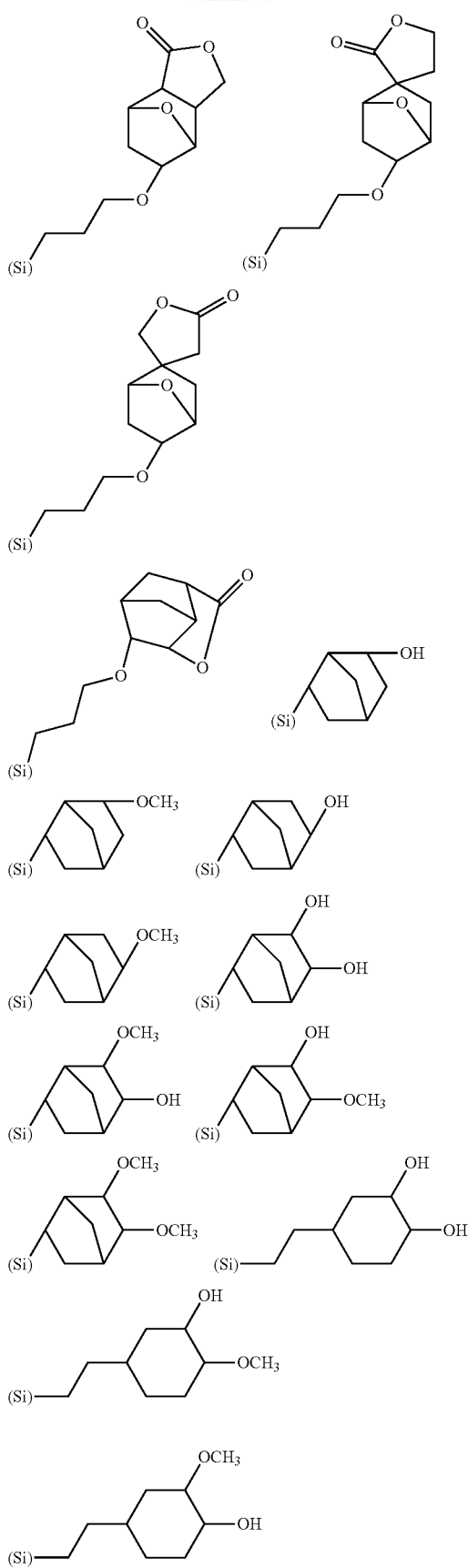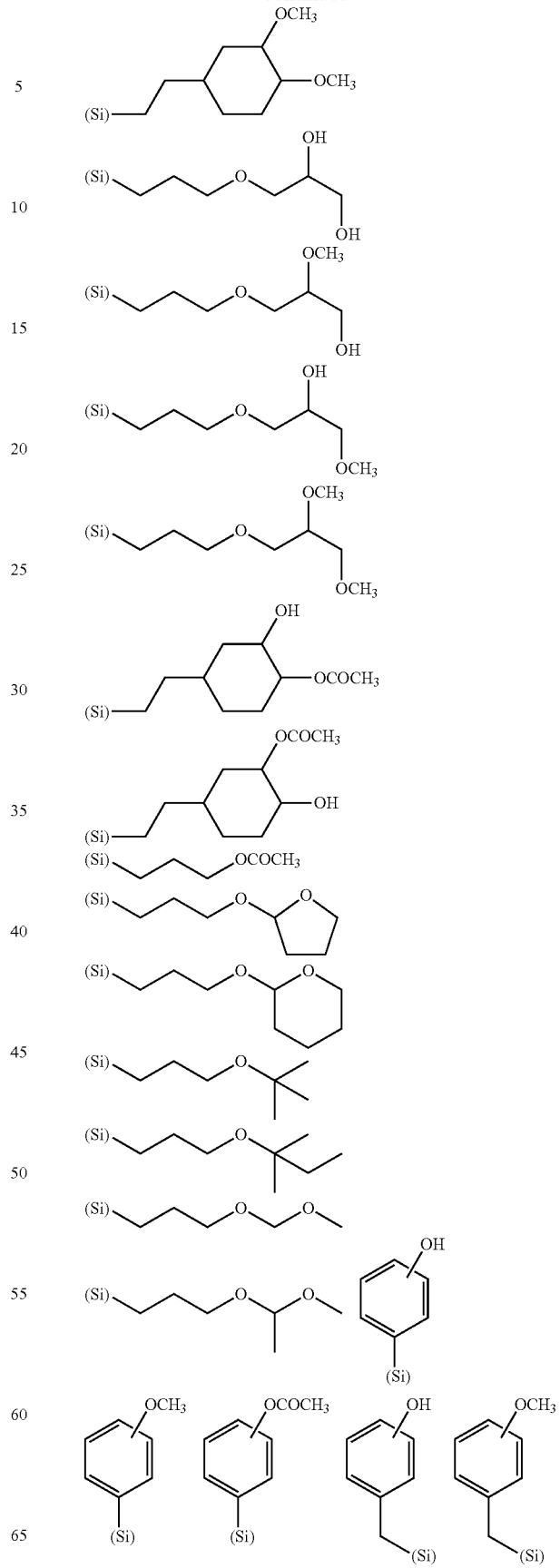

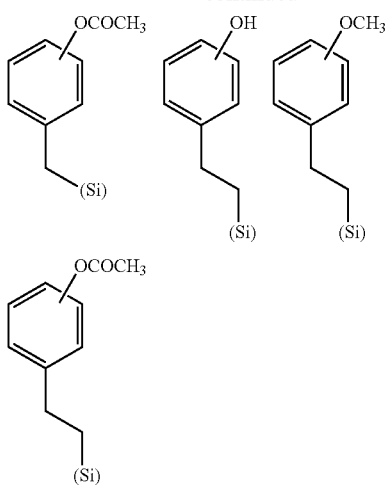

Moreover, as an example of the organic group of R⁴, R⁵, and R⁶, an organic group containing a silicon-silicon bond can also be used. Specific examples thereof include the following.

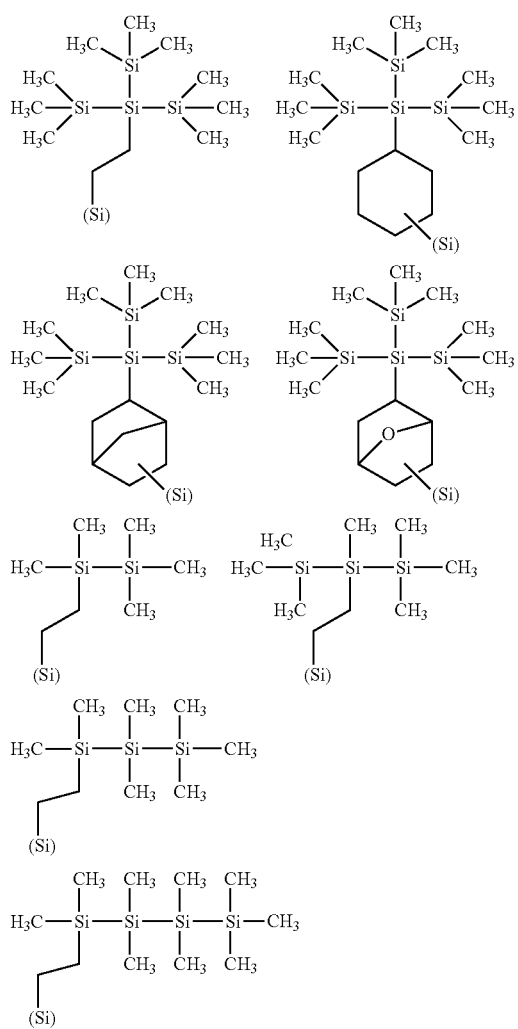

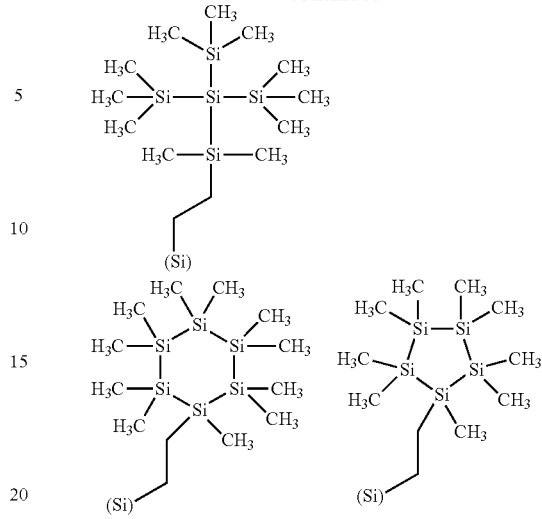

Moreover, as an example of the organic group of R⁴, R⁵, and R⁶, an organic group having a protective group that is decomposed with an acid can also be used. Specific examples thereof include organic groups shown from paragraphs [0043] to [0048] of JP 2013-167669A, and organic groups obtained from silicon compounds shown in paragraph [0056] of JP 2013-224279A.

Further, as an example of the organic group of R⁴, R⁵, and R⁶, an organic group having a fluorine atom can also be used. Specific examples thereof include organic groups obtained from silicon compounds shown from paragraphs [0059] to [0065] of JP 2012-53253A.

In the hydrolysable monomer (Sm), one, two, or three among chlorine, bromine, iodine, an acetoxy group, a methoxy group, an ethoxy group, a propoxy group, a butoxy group, and so forth are bonded as a hydrolysable group(s) on silicon shown by (Si) in the partial structure.

[Method for Synthesizing Thermally Crosslinkable Polysiloxane (Sx)]

(Synthesis Method 1: Acid Catalyst)

The thermally crosslinkable polysiloxane (Sx) used in the present invention can be produced by hydrolysis condensation of one of the hydrolysable monomers (Sm) or a mixture of two or more kinds thereof in the presence of an acid catalyst.

Examples of the acid catalyst used in this event include organic acids, such as formic acid, acetic acid, oxalic acid, maleic acid, methanesulfonic acid, benzenesulfonic acid, and toluenesulfonic acid; and inorganic acids, such as hydrofluoric acid, hydrochloric acid, hydrobromic acid, sulfuric acid, nitric acid, perchloric acid, and phosphoric acid. The catalyst can be used in an amount of $1\times10^{-6}$ to 10 mol, preferably $1\times10^{-5}$ to 5 mol, more preferably $1\times10^{-4}$ to 1 mol, relative to 1 mol of the monomer.

When the thermally crosslinkable polysiloxane (Sx) is obtained from these monomers by the hydrolysis condensation, water is preferably added in an amount: of 0.01 to 100 mol, more preferably 0.05 to 50 mol, further preferably 0.1 to 30 mol, per mol of the hydrolysable substituent bonded to the monomer. When the amount is 100 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, etc.

Among these solvents, water-soluble solvents are preferable. Examples thereof include alcohols, such as methanol, ethanol, 1-propanol, and 2-propanol; polyhydric alcohols, such as ethylene glycol and propylene glycol; polyhydric alcohol condensate derivatives, such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, etc. Among these, particularly preferable is one having a boiling point of 100° C. or less.

Note that the organic solvent is used in an amount of preferably 0 to 1,000 ml, particularly preferably 0 to 500 ml, relative to 1 mol of the monomer. When the organic solvent is used in a small amount, a small reaction vessel is required and economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the thermally crosslinkable polysiloxane solution is mixed with water, and the thermally crosslinkable polysiloxane is extracted with an organic solvent. Preferably, the organic solvent used in this event is capable of dissolving the thermally crosslinkable polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, etc.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, etc. However, the combination is not limited thereto.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermally crosslinkable polysiloxane may be washed with neutral water. As the water, what is commonly called deionized water or ultrapure water may be used. The amount of the water is preferably 0.01 to 100 L, more preferably 0.05 to 50 L, further preferably 0.1 to 5 L, relative to 1 L of the thermally crosslinkable polysiloxane solution. This washing procedure may be performed by putting both the thermally crosslinkable polysiloxane and water into the same container, followed by stirring and then leaving to stand to separate the aqueous layer. The washing may be performed once or more, preferably once to approximately five times because washing ten times or more does not always produce the full washing effects thereof.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the thermally crosslinkable polysiloxane escapes into the aqueous layer, so that substantially the same effect as fractionation operation is obtained in some cases. Hence, the number of water-washing operations and the amount of washing water may be appropriately determined in view of the catalyst removal effect and the fractionation effect.

To a solution of either the thermally crosslinkable polysiloxane with the acid catalyst still remaining or the thermally crosslinkable polysiloxane with the acid catalyst having been removed, a final solvent may be added for solvent exchange under reduced pressure. Thus, a desired thermally crosslinkable polysiloxane solution is obtained. The temperature during this solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the thermally crosslinkable polysiloxane may become unstable by the solvent exchange. This occurs due to incompatibility of the thermally crosslinkable polysiloxane with the final solvent. Thus, in order to prevent this phenomenon, a monohydric, dihydric, or polyhydric alcohol having cyclic ether substituent as shown in paragraphs [0181] to [0182] of JP 2009-126940A may be added as a stabilizer. The alcohol may be added in an amount of 0 to 25 parts by mass, preferably 0 to 15 parts by mass, more preferably 0 to 5 parts by mass, based on 100 parts by mass of the thermally crosslinkable polysiloxane in the solution before the solvent exchange. When the alcohol is added, the amount is preferably 0.5 parts by mass or more. If necessary, the monohydric, dihydric, or polyhydric alcohol having cyclic ether substituent may be added to the solution before the solvent exchange operation.

If the thermally crosslinkable polysiloxane is concentrated above a certain concentration level, the condensation reaction may further progress, so that the thermally crosslinkable polysiloxane becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the thermally crosslinkable polysiloxane solution is preferably an alcohol-based solvent, particularly preferably monoalkyl ether derivatives of ethylene glycol, diethylene glycol, triethylene glycol, propylene glycol, dipropylene glycol, butanediol, and so on. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, etc.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, etc.

As an alternative reaction operation using an acid catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives, such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, etc.

The organic solvent is used in an amount of preferably 0 to 1,000 ml, particularly preferably 0 to 500 ml, relative to 1 mol of the monomer. When the organic solvent is used in a small amount, a small reaction vessel is required and economical. The obtained reaction mixture may be subjected to post-treatment by the same procedure as mentioned above to obtain a thermally crosslinkable polysiloxane.
(Synthesis Method 2: Alkali Catalyst)

Alternatively, the thermally crosslinkable polysiloxane (Sx) can be produced by hydrolysis condensation of one of the hydrolysable monomers (Sm) or a mixture of two or more kinds thereof in the presence of an alkali catalyst.

Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. The catalyst can be used in an amount of $1\times10^{-6}$ mol to 10 mol, preferably $1\times10^{-5}$ mol to 5 mol, more preferably $1\times10^{-4}$ mol to 1 mol, relative to 1 mol of the silicon monomer.

When the thermally crosslinkable polysiloxane is obtained from the monomer by the hydrolysis condensation, water is preferably added in an amount of 0.1 to 50 mol per mol of the hydrolysable substituent bonded to the monomer. When the amount is 50 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution. In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the alkali catalyst used in the hydrolysis condensation, the thermally crosslinkable polysiloxane may be extracted with an organic solvent. Preferably, the organic solvent used in this event is capable of dissolving the thermally crosslinkable polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, etc.

Further, a mixture of a water-soluble organic solvent and a slightly-water-soluble organic solvent can also be used.

As concrete examples of the organic solvent used for removing the alkali catalyst, it is possible to use the aforementioned organic solvents specifically exemplified for the acid catalyst removal or the same mixtures of the water-soluble organic solvent and the slightly-water-soluble organic solvent.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermally crosslinkable polysiloxane may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the thermally crosslinkable polysiloxane solution. This washing procedure may be performed by putting both the thermally crosslinkable polysiloxane and water into the same container, followed by stirring and then leaving to stand to separate the aqueous layer. The washing may be performed once or more, preferably once to approximately five times because washing ten times or more does not always produce the full washing effects thereof.

To the washed thermally crosslinkable polysiloxane solution, a final solvent may be added for solvent exchange under reduced pressure. Thus, a desired thermally crosslinkable polysiloxane solution is obtained. The temperature during this solvent exchange is preferably 0 to 100° C., more preferably 10 to 90° C., further preferably 15 to 80° C., depending on the kind of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the thermally crosslinkable polysiloxane solution is preferably an alcohol-based solvent, particularly preferably a monoalkyl ether of ethylene glycol, diethylene glycol, triethylene glycol, etc., and a monoalkyl ether of propylene glycol, dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, diacetone alcohol, etc.

As an alternative reaction operation using an alkali catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

The organic solvent usable for the organic solution of the monomer or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives, such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, etc.

The molecular weight of the thermally crosslinkable polysiloxane obtained by the above synthesis method 1 or 2 can be adjusted not only through the selection of the monomer but also by controlling the reaction conditions during the polymerization. Nevertheless, it is preferable to use the thermally crosslinkable polysiloxane having a weight-average molecular weight of 100,000 or less, more preferably 200 to 50,000, further preferably 300 to 30,000. When the weight-average molecular weight is 100,000 or less, generation of foreign matters and coating spots is suppressed. Regarding data on the weight-average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Properties of the thermally crosslinkable polysiloxane used in the present invention vary depending on the kind of the acid or alkali catalyst used in the hydrolysis condensation and the reaction conditions. Thus, the catalyst and the reaction conditions can be appropriately selected in accordance with the characteristics of a resist underlayer film to be achieved.

Furthermore, a polysiloxane derivative produced from a mixture of one or more of the hydrolysable monomers (Sm) with a hydrolysable metal compound shown by the following general formula (Mm) under the conditions using the acid or alkali catalyst can be used as a component of the composition for forming a resist underlayer film.

$$U(OR^7)_{m7}(OR^8)_{m8} \quad (Mm)$$

In the formula, $R^7$ and $R^8$ each represent an organic group having 1 to 30 carbon atoms; m7+m8 represents the same number of a valence determined by the kind of U; m7 and m8 each represent an integer of 0 or more; and U represents an element belonging to the group III, IV, or V in the periodic table, except for carbon and silicon.

Examples of the hydrolysable metal compound shown by the general formula (Mm) include metal alkoxides of boron, aluminum, gallium, yttrium, germanium, titanium, hafnium, etc. Specifically, ones disclosed in [0107] to [0123] of JP 2020-118960A are usable.

(Acid Generator)

The inventive composition for forming a silicon-containing resist underlayer film may be further blended with one or more kinds of an acid generator. As the acid generator, any of a thermal-acid generator, a photoacid generator, an acid amplifier, and the like may be used, as long as the substance acts as an acid precursor. In the present invention, the acid generator to be blended is more preferably a sulfonium salt which is a photoacid generator and generates an acid by an action of a high energy beam. Specifically, materials disclosed in paragraphs [0061] to [0085] of JP 2007-199653A can be added, but the acid generator is not limited thereto.

One kind of the acid generator can be used singly, or two or more kinds thereof can be used in combination. When an acid generator is added, the amount is preferably 0.05 to 50 parts, more preferably 0.1 to 10 parts, based on 100 parts of the thermally crosslinkable polysiloxane.

[Other Components]
(Crosslinking Catalyst)

In the present invention, a crosslinking catalyst (Xc) may be blended into the composition for forming a silicon-containing resist underlayer film. An example of the blendable crosslinking catalyst includes a compound shown by the following general formula (Xc0):

$$L_aH_bA \quad (Xc0)$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the crosslinking catalyst used in the present invention as specific (Xc0) include a sulfonium salt of the following general formula (Xc-1); an iodonium salt of the following general formula (Xc-2); a phosphonium salt of the following general formula (Xc-3); an ammonium salt of the following general formula (Xc-4); an alkaline metal salt; a polysiloxane (Xc-10) having a structure partially containing an ammonium salt, a sulfonium salt, a phosphonium salt, or an iodonium salt; etc. Specifically, materials disclosed in paragraphs [0124] to [0163] of JP 2020-118960 A can be added, for example.

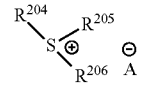

(Xc-1)

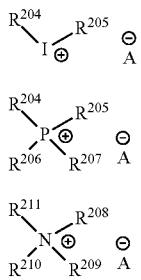

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion. $R^{201}$, $R^{209}$, $R^{210}$, and $R^{211}$ are the same as $R^{204}$, $R^{205}$, $R^{206}$, and $R^{207}$, but each may represent a hydrogen atom. $R^{208}$ and $R^{209}$, or $R^{208}$ and $R^{209}$ and $R^{210}$, may form a ring; when a ring is formed, $R^{208}$ and $R^{209}$, or $R^{208}$ and $R^{209}$ and $R^{210}$, represent an alkylene group having 3 to 10 carbon atoms.

One kind of the crosslinking catalysts (Xc-1), (Xc-2), (Xc-3), (Xc-4), and (Xc-10) can be used alone, or two or more kinds thereof can be used in combination. The crosslinking catalyst is added in an amount of preferably 0.01 to 50 parts by mass, more preferably 0.1 to 40 parts by mass, based on 100 parts by mass of the base polymer (e.g., the thermally crosslinkable polysiloxane (Sx) obtained by the above-described method).

The inventive composition for forming a silicon-containing resist underlayer film may be further blended with the following materials.

(Organic Acid)

To improve the stability of the inventive composition for forming a silicon-containing resist underlayer film, it is preferable to add a monovalent, divalent, or more polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, etc. Particularly, oxalic acid, maleic acid, formic acid, acetic acid, propionic acid, citric acid, and the like are preferable. Moreover, a mixture of two or more acids may be used to keep the stability.

The organic acid can be added in an amount of 0.001 to 25 parts by mass, preferably 0.01 to 15 parts by mass, more preferably 0.1 to 5 parts by mass, based on 100 parts by mass of the thermally crosslinkable polysiloxane contained in the inventive composition for forming a silicon-containing resist underlayer film.

Otherwise, the organic acid may be blended based on the pH of the inventive composition for forming a silicon-containing resist underlayer film so as to satisfy preferably 0≤pH≤7, more preferably 0.3≤pH≤6.5, further preferably 0.5≤pH≤6.

(Water)

In the present invention, water may be added to the composition. When water is added, the polysiloxane compound in the inventive composition for forming a silicon-containing resist underlayer film is hydrated, so that the lithography performance is improved. The water content in the solvent component of the inventive composition for forming a silicon-containing resist underlayer film may be more than 0 mass % and less than 50 mass %, particularly preferably 0.3 to 30 mass %, further preferably 0.5 to 20 mass %. When the amount of water added is in these ranges, the silicon-containing resist underlayer film has favorable uniformity, repelling will not occur, and the lithography performance will not be lowered, either.

The solvent including water is used in a total amount of preferably 100 to 100,000 parts by mass, particularly preferably 200 to 50,000 parts by mass, based on 100 parts by mass of the thermally crosslinkable polysiloxane (Sx), which is the base polymer.

(Stabilizer)

Further, in the present invention, a stabilizer can be added to the composition. As the stabilizer, a monohydric, dihydric, or polyhydric alcohol having cyclic ether substituent can be added. Particularly, adding stabilizers disclosed in paragraphs [0181] to [0182] of JP 2009-126940A enables stability improvement of the composition for forming a silicon-containing resist underlayer film.

(Surfactant)

Further, in the present invention, a surfactant can be blended into the composition as necessary. Specifically, the materials disclosed in paragraph [0185] of JP 2009-126940A can be added as the surfactant.

(High-Boiling-Point Solvent)

Further, in the present invention, a high-boiling-point solvent having a boiling point of 180° C. or more can also be added to the composition as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, etc.

[Patterning Processes]

(Patterning Process 1)

One of patterning processes of the present invention is a patterning process including steps of:
  forming an organic film by using a coating-type organic film material on a body to be processed;
  forming a silicon-containing resist underlayer film on the organic film by using the inventive composition for forming a silicon-containing resist underlayer film;

forming a resist upper layer film on the silicon-containing resist underlayer film by using a resist upper layer film composition composed of a photoresist composition;
forming a circuit pattern in the resist upper layer film;
transferring the pattern to the silicon-containing resist underlayer film by etching while using the resist upper layer film having the formed circuit pattern as a mask;
transferring the pattern to the organic film by etching while using the silicon-containing resist underlayer film having the transferred pattern as a mask; and
transferring the pattern to the body to be processed by etching while using the organic film having the transferred pattern as a mask (what is called "multilayer resist method").

(Patterning Process 2)

Another patterning process of the present invention is a patterning process including steps of:
forming an organic hard mask mainly containing carbon by a CVD method on a body to be processed;
forming a silicon-containing resist underlayer film on the hard mask by using the inventive composition for forming a silicon-containing resist underlayer film;
forming a resist upper layer film on the silicon-containing resist underlayer film by using a resist upper layer film composition composed of a photoresist composition;
forming a circuit pattern in the resist upper layer film;
transferring the pattern to the silicon-containing resist underlayer film by etching while using the resist upper layer film having the formed circuit pattern as a mask;
transferring the pattern to the hard mask by etching while using the silicon-containing resist underlayer film having the transferred pattern as a mask; and
transferring the pattern to the body to be processed by etching while using the hard mask having the transferred pattern as a mask (what is called "multilayer resist method").

When a coating-type organic film is formed on a body to be processed (these are formed under the silicon-containing resist underlayer film), the material used for the coating-type organic film preferably contains a compound having an aromatic ring. The use of such a coating-type organic film material can further suppress pattern collapse.

Meanwhile, when a CVD hard mask is formed on a body to be processed (these are formed under the silicon-containing resist underlayer film), a hard mask mainly containing carbon may be formed by a CVD method according to a known method.

When a resist pattern is formed using the inventive composition for forming a silicon-containing resist underlayer film, the combination with the organic film or hard mask is optimized as described above, so that an ultrafine pattern formed in the photoresist can be formed on the substrate while suppressing pattern collapse and keeping the favorable profile. Moreover, the silicon-containing resist underlayer film remaining after the pattern formation is easily removed by etching or other means. This makes it possible to suppress defect-causing residue and prevent substrate damage under excessive etching conditions.

When the silicon-containing resist underlayer film is formed, the body to be processed can be coated with the inventive composition for forming a silicon-containing resist underlayer film by a spin-coating method etc. After the spin coating, baking (heating) is performed to evaporate the solvent and to promote the crosslinking reaction, thereby preventing the mixing with a resist upper layer film made of a photoresist composition or an organic film made of a coating-type organic film material. The baking is preferably performed at 50° C. or more and 500° C. or less within 10 to 600 seconds, more preferably at 100° C. or more and 400° C. or less within 10 to 300 seconds.

Moreover, when the silicon-containing resist underlayer film is formed, the inventive composition for forming a silicon-containing resist underlayer film applied by the spin-coating method or the like on the substrate to be processed as described may be cured by baking in an atmosphere with an oxygen concentration of 0.1% or more and 21% or less to form the silicon-containing resist underlayer film.

A sufficiently cured film can be obtained by baking the silicon-containing resist underlayer film of the present invention in such an oxygen atmosphere. The atmosphere during the baking may be in air. An inert gas such as $N_2$, Ar, or He may be introduced into the atmosphere to reduce the oxygen amount, so that the organic resist underlayer film can be prevented from being oxidized. To prevent such oxidation, the oxygen concentration needs to be controlled, and is preferably 1000 ppm or less, more preferably 100 ppm or less.

The thickness of the silicon-containing resist underlayer film formed by using the inventive composition is determined appropriately, and is preferably 1 to 300 nm, more preferably 1 to 200 nm, further preferably 1 to 100 nm.

In the inventive patterning processes, the resist upper layer film composition is not particularly limited, as long as it is a chemical amplified photoresist composition. Note that both of positive development using an alkaline developer and negative development using an organic solvent developer can be adopted in the present invention, so that a positive type resist upper layer film material or a negative type resist upper layer film material can be appropriately selected depending on the development method.

Note that, in a positive patterning process, after the resist upper layer film formation and heat treatment, exposure and alkaline development with an alkaline developer are normally carried out to obtain a positive resist pattern. In addition, after the exposure, post exposure bake (PEB) is desirably performed.

As the alkaline developer, a tetramethylammonium hydroxide (TMAH) aqueous solution can be used, for example.

Meanwhile, in a negative patterning process, after the resist upper layer film formation and heat treatment, exposure and organic solvent development with an organic solvent are normally carried out to obtain a negative resist pattern. Additionally, after the exposure, PEB is desirably performed.

As the organic solvent developer, it is possible to use, for example, a developer containing one or more solvents selected from 4-methyl-2-pentanol, 2-octanone, 2-nonanone, 2-heptanone, 3-heptanone, 4-heptanone, 2-hexanone, 3-hexanone, diisobutyl ketone, methyl cyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

The inventive patterning processes suppress pattern collapse of the resist upper layer film and enable formation of a favorable pattern profile. Moreover, a pattern is favorably transferred to the silicon-containing resist underlayer film by dry etching. Furthermore, since the silicon-containing resist underlayer film remaining after the patterning is easily removed, defect due to the residue is hardly generated. Thus, the patterning processes are particularly practical for forming fine patterns.

In the step of forming a circuit pattern in the resist upper layer film, the pattern is preferably formed by a photolithography with a wavelength of 10 nm or more and 300 nm or less, a direct drawing with electron beam, nanoimprinting, or a combination thereof.

The body to be processed is preferably a semiconductor device substrate, a metal film, a metal carbide film, a metal oxide film, a metal nitride film, a metal oxycarbide film, or a metal oxynitride film.

When the body to be processed is like these, the effects of the present invention are more sufficiently exhibited.

A metal constituting the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

When the metal constituting the body to be processed is a certain metal as listed above, the effects of the present invention are more sufficiently exhibited.

EXAMPLE

Hereinafter, the present invention will be specifically described with reference to Synthesis Examples, Examples, and Comparative Examples. However, the present invention is not limited to these descriptions. Note that, in the following examples, % means mass %, and molecular weight Mw means weight-average molecular weight in terms of polystyrene determined by GPC measurement.

[Synthesis Examples] Synthesis of Compounds (A1) to (A7)

Compounds (A1) to (A7) were synthesized using (B1) to (B5) shown below as raw materials.

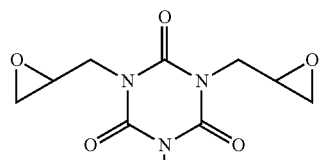

(B1)

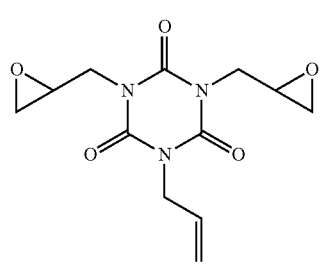

(B2)

Synthesis Example 1

Synthesis of Compound (A1)

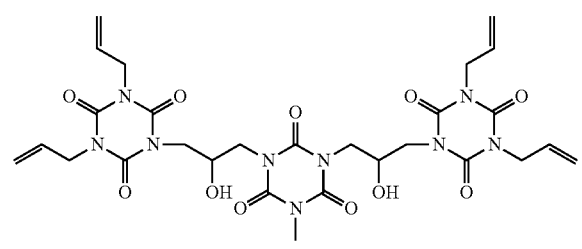

(A1)

Under nitrogen atmosphere, 20.0 g of (B1), 32.8 g of (B4), 0.05 g of BHT (dibutylhydroxytoluene), and 150 g of PGME (1-methoxypropanol) were added into a three-necked flask equipped with a thermometer and a reflux tube. The temperature inside the flask was increased to 80° C., and a homogeneous solution was prepared. Then, 1.00 g of benzyltriethylammonium chloride was added, and the reaction was allowed to proceed at 110° C. for 7 hours. After the completion of the reaction, the resultant was diluted with 400 ml of MIBK (methyl isobutyl ketone), subsequently transferred to a separation funnel, and washed twice with 100 g of a 1% ammonia aqueous solution, twice with 100 g of a 3% nitric acid aqueous solution, and five times with 100 ml of ultrapure water in this order. The organic phase was collected, concentrated, and dried. Thus, 51.0 g of Compound (A1) was obtained.

Synthesis Example 2

Synthesis of Compound (A2)

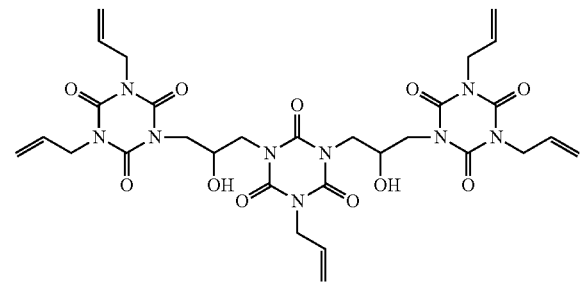

(A2)

Under nitrogen atmosphere, 20.0 g of (B2), 29.8 g of (B4), 0.05 g of BHT, and 150 g of PGME were added into a three-necked flask equipped with a thermometer and a reflux tube. The temperature inside the flask was increased to 80° C., and a homogeneous solution was prepared. Then, 1.00 g (0.4 mmol) of benzyltriethylammonium chloride was added, and the reaction was allowed to proceed at 110° C. for 7 hours. After the completion of the reaction, the resultant was diluted with 400 ml of MIBK, subsequently transferred to a separation funnel, and washed twice with 100 g of a 1% ammonia aqueous solution, twice with 100 g of a 3% nitric acid aqueous solution, and five times with 100 ml of ultrapure water in this order. The organic phase was collected, concentrated, and dried. Thus, 48.3 g of Compound (A2) was obtained.

Synthesis Example 3

Synthesis of Compound (A3)

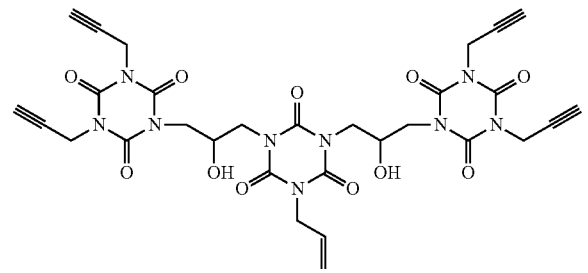

(A3)

Under nitrogen atmosphere, 20.0 g of (B2), 29.2 g of (B5), and 150 g of PGME were added into a three-necked flask equipped with a thermometer and a reflux tube. The temperature inside the flask was increased to 80° C., and a homogeneous solution was prepared. Then, 1.0 g of benzyltriethylammonium chloride was added, and the reaction was allowed to proceed at 110° C. for 7 hours. After the completion of the reaction, the resultant was diluted with 400 ml of MIBK, subsequently transferred to a separation funnel, and washed twice with 100 g of a 1% ammonia aqueous solution, twice with 100 g of a 3% nitric acid aqueous solution, and five times with 100 ml of ultrapure water in this order. The organic phase was collected, concentrated, and dried. Thus, 46.7 g of Compound (A3) was obtained.

Synthesis Example 4

Synthesis of Compound (A4)

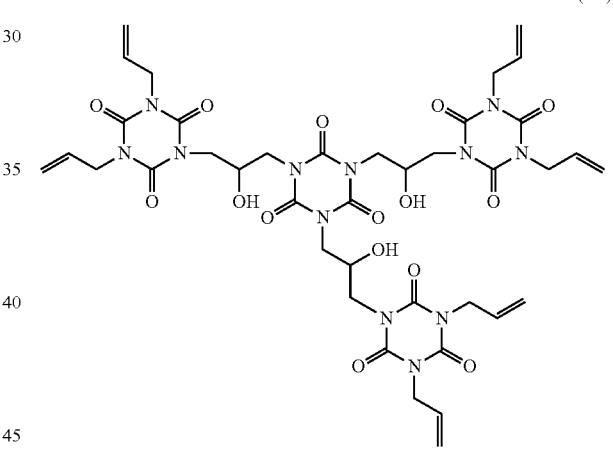

(A4)

Under nitrogen atmosphere, 20.0 g of (B3), 42.2 g of (B4), 0.05 g of BHT, and 200 g of PGME were added into a three-necked flask equipped with a thermometer and a reflux tube. The temperature inside the flask was increased to 80° C., and a homogeneous solution was prepared. Then, 1.0 g of benzyltriethylammonium chloride was added, and the reaction was allowed to proceed at 110° C. for 7 hours. After the completion of the reaction, the resultant was diluted with 500 ml of MIBK, subsequently transferred to a separation funnel, and washed twice with 125 g of a 1% ammonia aqueous solution, twice with 125 g of a 3% nitric acid aqueous solution, and five times with 125 ml of ultrapure water in this order. The organic phase was collected, concentrated, and dried. Thus, 59.7 g of Compound (A4) was obtained.

Synthesis Example 5

Synthesis of Compound (A5)

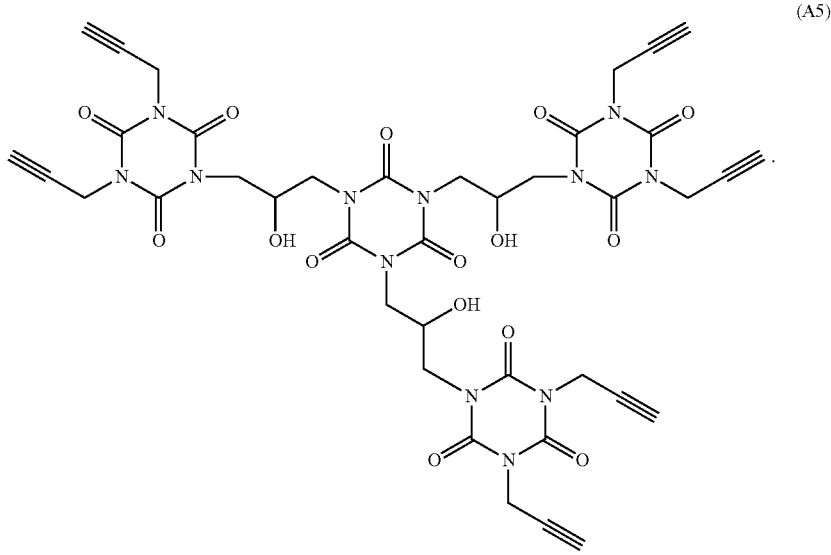 [SMILES: C#CCn1c(=O)n(CC#C)c(=O)n(CC(O)Cn2c(=O)n(CC(O)Cn3c(=O)n(CC#C)c(=O)n(CC#C)c3=O)c(=O)n(CC(O)Cn3c(=O)n(CC#C)c(=O)n(CC#C)c3=O)c2=O)c1=O]

(A5)

Under nitrogen atmosphere, 20.0 g of (B3), 41.4 g of (B5), and 200 g of PGME were added into a three-necked flask equipped with a thermometer and a reflux tube. The temperature inside the flask was increased to 80° C., and a homogeneous solution was prepared. Then, 1.0 g of benzyltriethylammonium chloride was added, and the reaction was allowed to proceed at 110° C. for 7 hours. After the completion of the reaction, the resultant was diluted with 500 ml of MIBK, subsequently transferred to a separation funnel, and washed twice with 125 g of a 1% ammonia aqueous solution, twice with 125 g of a 3% nitric acid aqueous solution, and five times with 125 ml of ultrapure water in this order. The organic phase was collected, concentrated, and dried. Thus, 60.2 g of Compound (A5) was obtained.

Synthesis Example 6

Synthesis of Compound (A6)

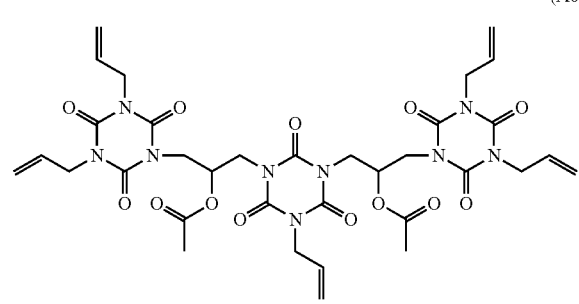

(A6)

20.0 g of Compound (A2), 11.3 g of pyridine, and 80 g of N-methylpyrrolidone were mixed to prepare a homogeneous solution under nitrogen atmosphere at room temperature. After 11.7 g of acetic anhydride was slowly added dropwise, the reaction was allowed to proceed at 40° C. for 3 hours. After the completion of the reaction, 200 ml of MIBK were added. Then, while the mixture was being cooled with an ice bath, 100 g of ultrapure water was slowly added thereto, and the reaction was quenched. After the quenching, the resultant was transferred to a separation funnel, and the aqueous layer was removed. The organic layer was washed twice with 100 g of a 2% NaHCO$_3$ aqueous solution, twice with 60 g of a 3% nitric acid aqueous solution, and six times with 60 g of pure water. The resulting organic layer was dried under reduced pressure. To the residue, 60 g of THF was added, and a homogeneous solution was prepared. Subsequently, a crystal was precipitated with 200 g of hexane. The precipitated crystal was separated by filtration, washed twice with 200 g of hexane, and collected. The collected crystal was vacuum dried at 40° C. Thus, 18.5 g of (A6) was obtained.

Synthesis Example 7

Synthesis of Compound (A7)

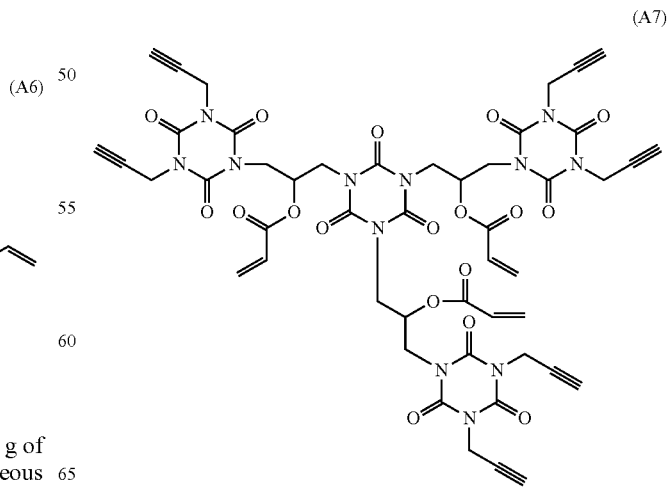

(A7)

20.0 g of Compound (A5), 11.1 g of triethylamine, 0.05 g of ANTAGE W-400, and 80 g of N-methylpyrrolidone were mixed to prepare a homogeneous solution under nitrogen atmosphere in an ice bath. After 7.9 g of acryloyl chloride was slowly added dropwise, the reaction was allowed to proceed at room temperature for 3 hours. After the completion of the reaction, 200 ml of MIBK was added. Then, while the mixture was being cooled with an ice bath, 100 g of a 5% hydrochloric acid aqueous solution was slowly added thereto, and the reaction was quenched. After the quenching, the resultant was transferred to a separation funnel, and the aqueous layer was removed. The organic layer was washed six times with 60 g of a 3% nitric acid aqueous solution and 60 g of pure water. The resulting organic layer was dried under reduced pressure. To the residue, 60 g of THF was added, and a homogeneous solution was prepared. Subsequently, a crystal was precipitated with 300 g of hexane. The precipitated crystal was separated by filtration, washed twice with 200 g of hexane, and collected. The collected crystal was vacuum dried at 40° C. Thus, 20.5 g of (A7) was obtained.

[Synthesis Examples] Synthesis of Thermally Crosslinkable Polysiloxanes (C1) to (C3)

Synthesis Example 8

Synthesis of Polysiloxane (C1)

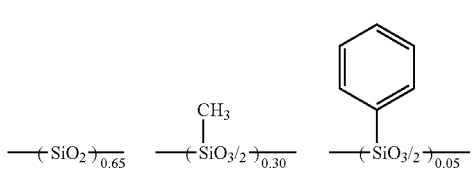

(C1)

120 g of methanol, 0.1 g of 10% nitric acid, and 60 g of ultrapure water were mixed to prepare a homogeneous solution under nitrogen atmosphere at 40° C. Then, a mixture containing 49.4 g of tetramethoxysilane, 20.4 g of methyltrimethoxysilane, and 5.0 g of phenyltrimethoxysilane was slowly added dropwise. After the dropwise addition, the hydrolysis condensation reaction was allowed to proceed at 40° C. for 12 hours. After the completion of the reaction, 600 g of PGEE (propylene glycol ethyl ether) was added, and water and by-produced alcohol were distilled off. Thus, 400 g of a PGEE solution containing Polysiloxane Compound (C1) was collected (compound concentration: 10%). The molecular weight of Polysiloxane Compound (C1) was measured in terms of polystyrene and found Mw=2600.

Synthesis Example 9

Synthesis of Polysiloxane (C2)

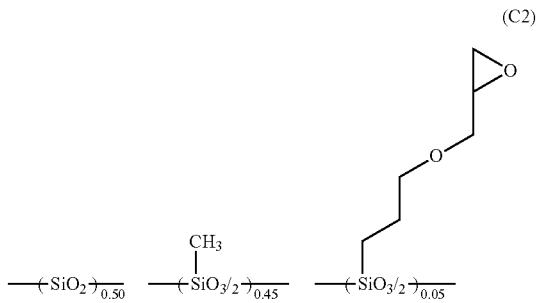

(C2)

120 g of methanol, 0.1 g of 10% nitric acid, and 60 g of ultrapure water were mixed to prepare a homogeneous solution under nitrogen atmosphere at 40° C. Then, a mixture containing 38.1 g of tetramethoxysilane, 30.6 g of methyltrimethoxysilane, and 5.9 g of 3-glycidoxypropyltrimethoxysilane was slowly added dropwise. After the dropwise addition, the hydrolysis condensation reaction was allowed to proceed at 40° C. for 12 hours. After the completion of the reaction, 600 g of PGEE (propylene glycol ethyl ether) was added, and water and by-produced alcohol were distilled off. Thus, 440 g of a PGEE solution containing Polysiloxane Compound (C2) was collected (compound concentration: 10%). The molecular weight of Polysiloxane Compound (C2) was measured in terms of polystyrene and found Mw=2900.

Synthesis Example 10

Synthesis of Polysiloxane (C3)

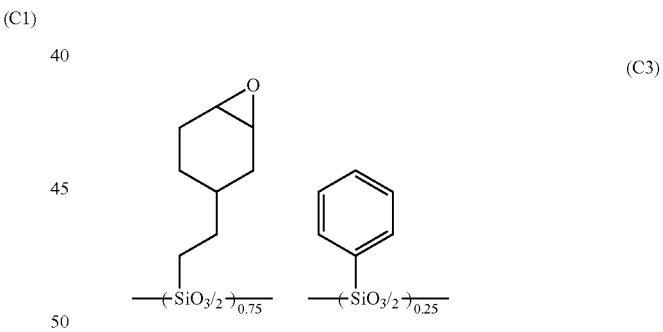

(C3)

1400 g of ethanol, 700 g of ultrapure water, and 50 g of 25% tetramethylammonium hydroxide were mixed to prepare a homogeneous solution under nitrogen atmosphere at 40° C. A mixture containing 138.6 g of 2-(3,4-epoxycyclohexyl)ethyltrimethoxysilane and 37.2 g of phenyltrimethoxysilane was slowly added dropwise. Then, the reaction was allowed to proceed at 40° C. for 2 hours. After the completion of the reaction, 35 g of acetic acid was added to stop the reaction, and ethanol was distilled off under reduced pressure. After the distillation, 2000 ml of ethyl acetate was added to the solution, and the aqueous layer was separated. The organic layer was washed twice with 400 ml of ultrapure water. Subsequently, 1000 g of PGMEA (propylene glycol monomethyl ether acetate) was added, and water and low-boiling point solvent were distilled off. Thus, 600 g of a PGMEA solution containing Polysiloxane Compound (C3)

was collected (compound concentration: 20%). The molecular weight of Polysiloxane Compound (C3) was measured in terms of polystyrene and found Mw-2800.

Examples, Comparative Examples

Compounds (A1) to (A7) and Polysiloxane Compounds (C1) to (C3) obtained in Synthesis Examples, as well as crosslinking catalysts, photoacid generators (PAG1 to PAG3 shown in Table 3), acid (maleic acid), solvents, and water were mixed at ratio shown in Tables 1 to 3. Each mixture was filtered through a 0.1-μm filter made of fluorinated resin. Thus, composition solutions for forming a silicon-containing resist underlayer film were prepared and referred to as Sol. 1 to Sol. 41 hereinbelow.

TABLE 1

| No. | Polysiloxane (parts by mass) | Compound (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|---|
| Sol.1 | C1 1.0 | A1 0.1 | TPSNO3 0.03 | none | maleic acid 0.01 | PGEE 90 | water 10 |
| Sol.2 | C1 1.0 | A2 0.1 | QBANO3 0.03 | none | maleic acid 0.01 | PGEE 90 | water 10 |
| Sol.3 | C1 1.0 | A3 0.1 | QBANO3 0.03 | none | maleic acid 0.01 | PGEE 90 | water 10 |
| Sol.4 | C1 1.0 | A4 0.1 | TPSNO3 0.03 | none | maleic acid 0.01 | PGEE 90 | water 10 |
| Sol.5 | C1 1.0 | A5 0.1 | QBANO3 0.03 | none | maleic acid 0.01 | PGEE 90 | water 10 |
| Sol.6 | C1 1.0 | A6 0.1 | TPSNO3 0.03 | none | maleic acid 0.01 | PGEE 90 | water 10 |
| Sol.7 | C1 1.0 | A7 0.1 | QBANO3 0.03 | none | maleic acid 0.01 | PGEE 90 | water 10 |
| Sol.8 | C2 1.0 | A1 0.1 | TPSNO3 0.03 | none | maleic acid 0.01 | PGEE 90 | water 10 |
| Sol.9 | C2 1.0 | A2 0.1 | QBANO3 0.03 | none | maleic acid 0.01 | PGEE 90 | water 10 |
| Sol.10 | C2 1.0 | A3 0.1 | TPSNO3 0.03 | none | maleic acid 0.01 | PGEE 90 | water 10 |
| Sol.11 | C2 1.0 | A4 0.1 | QBANO3 0.03 | none | maleic acid 0.01 | PGEE 90 | water 10 |
| Sol.12 | C2 1.0 | A5 0.1 | TPSNO3 0.03 | none | maleic acid 0.01 | PGEE 90 | water 10 |
| Sol.13 | C2 1.0 | A6 0.1 | TPSNO3 0.03 | none | maleic acid 0.01 | PGEE 90 | water 10 |
| Sol.14 | C2 1.0 | A7 0.1 | QBANO3 0.03 | none | maleic acid 0.01 | PGEE 100 | water 10 |

TABLE 2

| No. | Polysiloxane (parts by mass) | Compound (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|---|
| Sol.15 | C3 1.0 | A1 01 | TEAHNf 0.03 | none | none | PGMEA 100 | none |
| Sol.16 | C3 1.0 | A2 0.1 | TEAHNf 0.03 | none | none | PGMEA 100 | none |
| Sol.17 | C3 1.0 | A3 0.1 | TEAHNf 0.03 | none | none | PGMEA 100 | none |
| Sol.18 | C3 1.0 | A4 0.1 | TEAHNf 0.03 | none | none | PGMEA 100 | none |
| Sol.19 | C.3 1.0 | A5 0.1 | TEAHNf 0.03 | none | none | PGMEA 100 | none |

TABLE 2-continued

| No. | Polysiloxane (parts by mass) | Compound (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|---|
| Sol.20 | C3 1.0 | A6 0.1 | TEAHNf 0.03 | none | none | PGMEA 100 | none |
| Sol.21 | C3 1.0 | A7 0.1 | TEAHNf 0.03 | none | none | PGMEA 100 | none |
| Sol.22 | C1 1.0 | A2 0.1 | QBANO3 0.03 | PAG1 0.01 | maleic acid 0.01 | PGEE 90 | water 10 |
| Sol.23 | C1 1.0 | A3 0.1 | QBANO3 0.03 | PAG2 0.01 | maleic acid 0.01 | PGEE 90 | water 10 |
| Sol.24 | C1 1.0 | A6 0.1 | TPSNO3 0.03 | PAG3 0.01 | maleic acid 0.01 | PGEE 90 | water 10 |
| Sol.25 | C2 1.0 | A2 0.1 | QBANO3 0.03 | PAG1 0.01 | maleic acid 0.01 | PGEE 90 | water 10 |
| Sol.26 | C2 1.0 | A2 0.1 | QBANO3 0.03 | PAG2 0.01 | maleic acid 0.01 | PGEE 90 | water 10 |
| Sol.27 | C2 1.0 | A2 0.1 | QBANO3 0.03 | PAG3 0.01 | maleic acid 0.01 | PGEE 90 | water 10 |
| Sol.28 | C2 1.0 | A3 0.1 | TPSNO3 0.03 | PAG1 0.01 | maleic acid 0.01 | PGEE 90 | water 10 |

TABLE 3

| No. | Polysiloxane (parts by mass) | Compound (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|---|
| Sol.29 | C2 1.0 | A3 0.1 | TPSNO3 0.03 | PAG2 0.01 | maleic acid 0.01 | PGEE 90 | water 10 |
| Sol.30 | C2 1.0 | A3 0.1 | TPSNO3 0.03 | PAG3 0.01 | maleic acid 0.01 | PGEE 90 | water 10 |
| Sol.31 | C2 1.0 | A6 0.1 | TPSNO3 0.03 | PAG1 0.01 | maleic acid 0.01 | PGEE 90 | water 10 |
| Sol.32 | C2 1.0 | A6 0.1 | TPSNO3 0.03 | PAG2 0.01 | maleic acid 0.01 | PGEE 90 | water 10 |
| Sol.33 | C2 1.0 | A6 0.1 | TPSNO3 0.03 | PAG3 0.01 | maleic acid 0.01 | PGEE 90 | water 10 |
| Sol.34 | C3 1.0 | A2 0.1 | TEAHNf 0.03 | PAG1 0.01 | none | PGMEA 100 | none |
| Sol.35 | C3 1.0 | A3 0.1 | TEAHNf 0.03 | PAG2 0.01 | none | PGMEA 100 | none |
| Sol.36 | C3 1.0 | A6 0.1 | TEANHf 0.03 | PAG3 0.01 | none | PGMEA 100 | none |
| Sol.37 | C1 1.0 | none | TPSNO3 0.01 | none | maleic acid 0.01 | PGEE 90 | water 10 |
| Sol.38 | C2 1.0 | none | QBANO3 0.01 | none | maleic acid 0.01 | PGEE 90 | water 10 |
| Sol.39 | C3 1.0 | none | TEAHNf 0.01 | none | none | PGMEA 100 | none |
| Sol.40 | C1 1.0 | none | TPSNO3 0.03 | PAG3 0.01 | maleic acid 0.01 | PGEE 90 | water 10 |
| Sol.41 | C2 1.0 | none | QBANO3 0.01 | PAG1 0.01 | maleic acid 0.01 | PGEE 90 | water 10 |

The following crosslinking catalysts were used.
TPSNO₃ . . . triphenylsulfonium nitrate
QBANO₃ . . . tetrabutylammonium nitrate
TEAHNf . . . triethylammonium nonaflate
The following solvents were used.
PGEE . . . propylene glycol ethyl ether
PGMEA . . . propylene glycol methyl ether acetate
The following photoacid generators shown in Table 4 were used.

TABLE 4

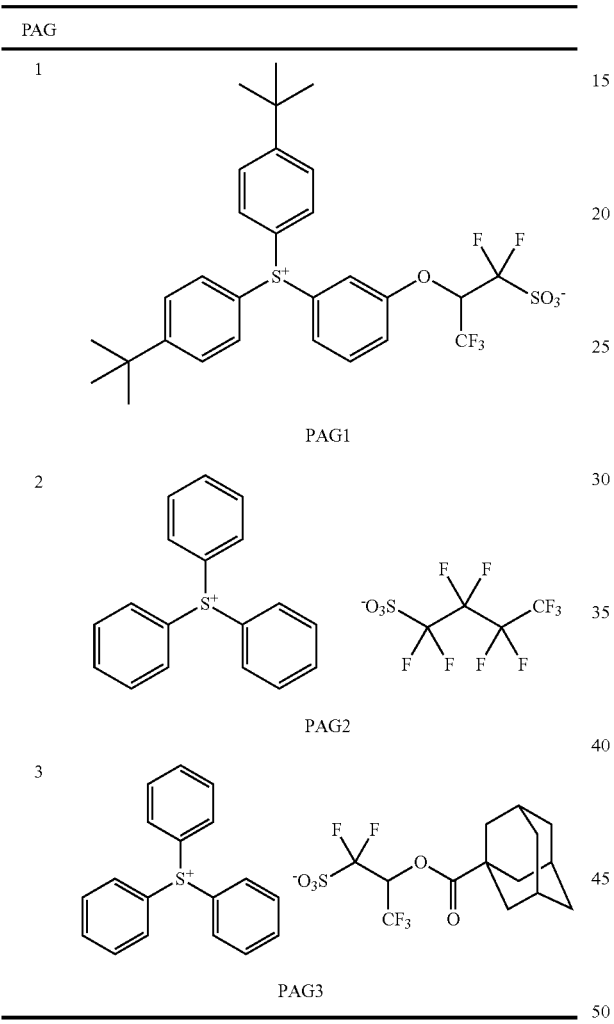

Examples 1-1 to 1-36, Comparative Examples 1-1 to 1-5

(EUV Patterning Test)

A silicon wafer (Si substrate) was spin-coated with one of the composition Sols. 1 to 41 for forming a silicon-containing resist underlayer film, and heated at 220° C. for 60 seconds. In this way, silicon-containing resist underlayer films (polysiloxane resist underlayer films) were prepared as Films 1 to 41 each of which had a film thickness of 25 nm.

Subsequently, Films 1 to 41 were each spin-coated with a resist material in which the following components were dissolved at ratios in Table 5, and prebaked at 105° C. for 60 seconds using a hot plate to prepare a resist film having a film thickness of 35 nm. The resultant was exposed using an EUV scanner NXE3300 (manufactured by ASML, NA: 0.33, a: 0.9/0.6, quadrupole illumination for an L/S pattern with a pitch of 36 nm (on-wafer size)), followed by PEB at 100° C. for 60 seconds on the hot plate and development with a 2.38 mass % TMAH aqueous solution for 30 seconds to obtain a line with a dimension of 18 nm.

The resulting line dimension was measured with a CD-SEM (CG5000) manufactured by Hitachi High-Technologies Corporation, and evaluated to be: good if no pattern collapse with a line width of 15 nm was observed; or poor if a pattern collapse was observed. Moreover, the sectional shape (pattern profile) was observed with an electron microscope (S-4800) manufactured by Hitachi High-Technologies Corporation, and evaluated to be: good if no footing was observed; or poor if footing was clearly observed. The pattern roughness was observed and measured with an electron microscope (CG4000) manufactured by Hitachi High-Technologies Corporation.

The following polymer, quencher, sensitizer, surfactant, and organic solvents were used as the resist materials.

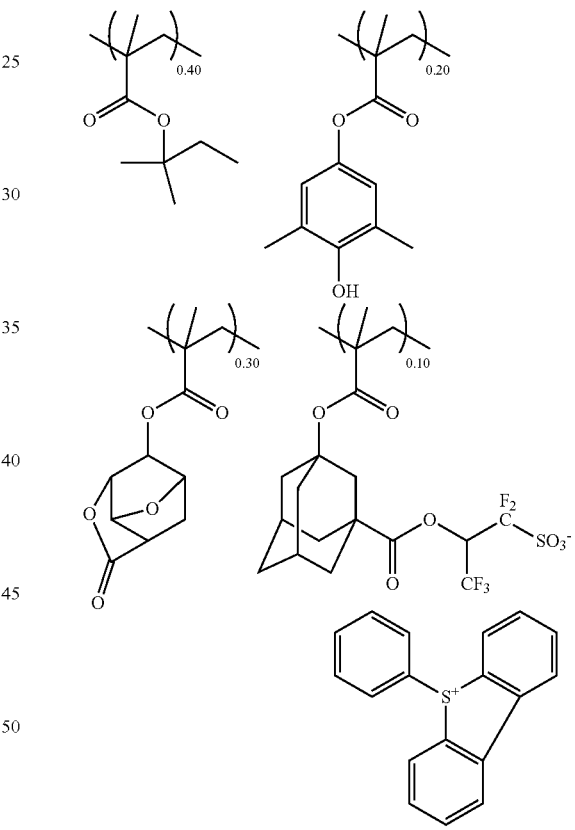

Polymer
Mw = 8,900
Mw/Mn - 1.89

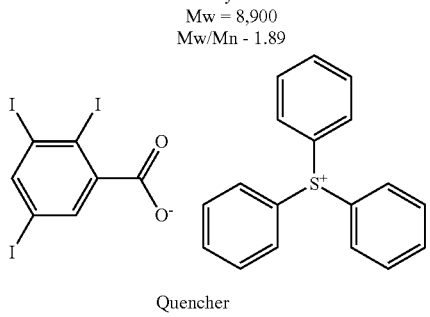

Quencher

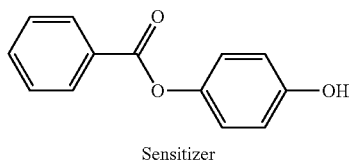

Sensitizer

Surfactant: FC-4430 manufactured by 3M
PGMEA: propylene glycol monomethyl ether acetate
CyHO: cyclohexanone
PGME: propylene glycol monomethyl ether

TABLE 5

| Components | Polymer | Quencher | Sensitizer | Surfactant | Organic solvents |
|---|---|---|---|---|---|
| Composition (parts by mass) | (100) | (4.0) | (2.1) | (0.25) | PGMEA (400) CyHO (2000) PGME (100) |

Tables 6 and 7 show the test results.

TABLE 6

| | Composition for forming silicon-containing resist underlayer film | Silicon-containing resist underlayer film | Pattern collapse | Pattern profile | Pattern roughness |
|---|---|---|---|---|---|
| Example 1-1 | Sol.1 | Film.1 | good | good | 2.7 |
| Example 1-2 | Sol.2 | Film.2 | good | good | 2.6 |
| Example 1-3 | Sol.3 | Film.3 | good | good | 2.8 |
| Example 1-4 | Sol.4 | Film.4 | good | good | 2.6 |
| Example 1-5 | Sol.5 | Film.5 | good | good | 2.4 |
| Example 1-6 | Sol.6 | Film.6 | good | good | 2.7 |
| Example 1-7 | Sol.7 | Film.7 | good | good | 2.5 |
| Example 1-8 | Sol.8 | Film.8 | good | good | 2.8 |
| Example 1-9 | Sol.9 | Film.9 | good | good | 2.5 |
| Example 1-10 | Sol.10 | Film.10 | good | good | 2.4 |
| Example 1-11 | Sol.11 | Film.11 | good | good | 2.6 |
| Example 1-12 | Sol.12 | Film.12 | qood | good | 2.7 |
| Example 1-13 | Sol.13 | Film.13 | good | good | 2.8 |
| Example 1-14 | Sol.14 | Film.14 | good | good | 2.5 |
| Example 1-15 | Sol.15 | Film.15 | good | good | 2.6 |
| Example 1-16 | Sol.16 | Film.16 | good | good | 2.8 |
| Example 1-17 | Sol.17 | Film.17 | good | good | 2.5 |
| Example 1-18 | Sol.18 | Film.18 | good | good | 2.7 |
| Example 1-19 | Sol.19 | Film.19 | good | good | 2.6 |
| Example 1-20 | Sol.20 | Film.20 | good | good | 2.4 |
| Example 1-21 | Sol.21 | Film.21 | good | good | 2.8 |

TABLE 7

| | Composition for forming containing resist underlayer film | Silicon containing resist film | Pattern collapse | Pattern profile | Pattern roughness |
|---|---|---|---|---|---|
| Example 1-22 | Sol.22 | Film.22 | good | good | 2.3 |
| Example 1-23 | Sol.23 | Film.23 | good | good | 2.4 |
| Example 1-24 | Sol.24 | Film.24 | good | good | 2.3 |
| Example 1-25 | Sol 25 | Film.25 | good | good | 2.6 |
| Example 1-26 | Sol.26 | Film.26 | good | good | 2.5 |
| Example 1-27 | Sol.27 | Film.27 | good | good | 2.5 |
| Example 1-28 | Sol.28 | Film.28 | good | good | 2.6 |
| Example 1-29 | Sol.29 | Film.29 | good | good | 2.4 |
| Example 1-30 | Sol.30 | Film.30 | good | good | 2.7 |
| Example 1-31 | Sol.31 | Film.31 | good | good | 2.5 |
| Example 1-32 | Sol.32 | Film.32 | good | good | 2.6 |
| Example 1-33 | Sol.33 | Film.33 | good | good | 2.3 |
| Example 1-34 | Sol.34 | Film.34 | good | good | 2.5 |
| Example 1-35 | Sol.35 | Film.35 | good | good | 2.8 |
| Example 1-36 | Sol.36 | Film.36 | good | good | 2.5 |
| Comparative Example 1-1 | Sol.37 | Film.37 | poor | poor | 3.4 |
| Comparative Example 1-2 | Sol.38 | Film.38 | poor | poor | 3.5 |
| Conparative Example 1-3 | Sol.39 | Film.39 | poor | poor | 3.3 |
| Camparative Example 1-4 | Sol.40 | Film.40 | poor | good | 4.0 |
| Comparative Example 1-5 | Sol.41 | Film.41 | poor | good | 3.9 |

It was verified as shown in Tables 6 and 7 that in Examples 1-1 to 1-36 incorporating Compounds (A1) to (A7), which are essential in the inventive composition for forming a silicon-containing resist underlayer film, the effect of suppressing pattern collapse and favorable pattern profiles were observed, and the pattern roughnesses were favorable, too.

In contrast, in Comparative Examples 1-1 to 1-3, the compound shown by the general formula (A-1) used in the present invention was not incorporated, so that pattern collapses occurred, and the pattern profiles and pattern roughnesses were inferior. Meanwhile, in Comparative Examples 1-4 and 1-5, the improvement in pattern profile by adding PAG was observed. However, since the compound shown by the general formula (A-1) was not incorporated, degradations of pattern collapse and pattern roughness were observed. This also indicates that adding Compounds (A1) to (A7) used in the present invention not only remedies the collapse of fine patterns with a line width of 15 nm or more, but also is effective in improving pattern profile and pattern roughness.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A composition for forming a silicon-containing resist underlayer film, comprising:
   a compound shown by the following general formula (A-1); and
   a thermally crosslinkable polysiloxane,

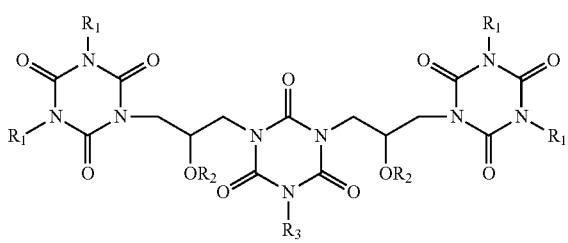

(A-1)

wherein $R_1$ represents a methyl group, an ethyl group, a propyl group, an allyl group, or a propargyl group; $R_2$ represents a hydrogen atom, an acetyl group, an acryloyl group, a methacryloyl group, a benzoyl group, a naphthoyl group, or an anthranoyl group; and $R_3$ represents a methyl group, an ethyl group, a propyl group, an allyl group, a propargyl group, or a group shown by the following general formula (A-2),

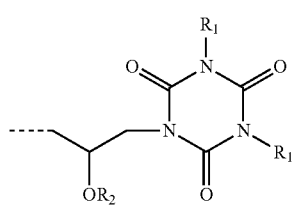

(A-2)

wherein a broken line represents a bonding arm; and $R_1$ and $R_2$ are as defined above.

2. The composition for forming a silicon-containing resist underlayer film according to claim 1, wherein
   the thermally crosslinkable polysiloxane comprises any one or more of a repeating unit shown by the following general formula (Sx-1), a repeating unit shown by the following general formula (Sx-2), and a partial structure shown by the following general formula (Sx-3),

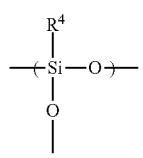

(Sx-1)

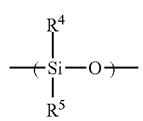

(Sx-2)

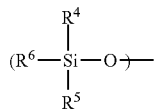

(Sx-3)

wherein $R^4$, $R^5$, and $R^6$ are identical to or different from one another, and each represent a monovalent organic group having 1 to 30 carbon atoms.

3. The composition for forming a silicon-containing resist underlayer film according to claim 1, further comprising an acid generator.

4. The composition for forming a silicon-containing resist underlayer film according to claim 2, further comprising an acid generator.

5. The composition for forming a silicon-containing resist underlayer film according to claim 3, wherein the acid generator is a sulfonium salt which is a photoacid generator and generates an acid by an action of a high energy beam.

6. The composition for forming a silicon-containing resist underlayer film according to claim 4, wherein the acid generator is a sulfonium salt which is a photoacid generator and generates an acid by an action of a high energy beam.

7. A patterning process for forming a pattern in a body to be processed, comprising steps of:
   forming an organic film by using a coating-type organic film material on a body to be processed;
   forming a silicon-containing resist underlayer film on the organic film by using the composition for forming a silicon-containing resist underlayer film according to claim 1;
   forming a resist upper layer film on the silicon-containing resist underlayer film by using a resist upper layer film composition composed of a photoresist composition;
   forming a circuit pattern in the resist upper layer film;
   transferring the pattern to the silicon-containing resist underlayer film by etching while using the resist upper layer film having the formed circuit pattern as a mask;
   transferring the pattern to the organic film by etching while using the silicon-containing resist underlayer film having the transferred pattern as a mask; and
   transferring the pattern to the body to be processed by etching while using the organic film having the transferred pattern as a mask.

8. A patterning process for forming a pattern in a body to be processed, comprising steps of:
   forming an organic film by using a coating-type organic film material on a body to be processed;
   forming a silicon-containing resist underlayer film on the organic film by using the composition for forming a silicon-containing resist underlayer film according to claim 2;
   forming a resist upper layer film on the silicon-containing resist underlayer film by using a resist upper layer film composition composed of a photoresist composition;
   forming a circuit pattern in the resist upper layer film;
   transferring the pattern to the silicon-containing resist underlayer film by etching while using the resist upper layer film having the formed circuit pattern as a mask;
   transferring the pattern to the organic film by etching while using the silicon-containing resist underlayer film having the transferred pattern as a mask; and
   transferring the pattern to the body to be processed by etching while using the organic film having the transferred pattern as a mask.

9. A patterning process for forming a pattern in a body to be processed, comprising steps of:

forming an organic film by using a coating-type organic film material on a body to be processed;

forming a silicon-containing resist underlayer film on the organic film by using the composition for forming a silicon-containing resist underlayer film according to claim 3;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching while using the resist upper layer film having the formed circuit pattern as a mask;

transferring the pattern to the organic film by etching while using the silicon-containing resist underlayer film having the transferred pattern as a mask; and transferring the pattern to the body to be processed by etching while using the organic film having the transferred pattern as a mask.

10. A patterning process for forming a pattern in a body to be processed, comprising steps of:

forming an organic film by using a coating-type organic film material on a body to be processed;

forming a silicon-containing resist underlayer film on the organic film by using the composition for forming a silicon-containing resist underlayer film according to claim 4;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching while using the resist upper layer film having the formed circuit pattern as a mask;

transferring the pattern to the organic film by etching while using the silicon-containing resist underlayer film having the transferred pattern as a mask; and transferring the pattern to the body to be processed by etching while using the organic film having the transferred pattern as a mask.

11. A patterning process for forming a pattern in a body to be processed, comprising steps of:

forming a hard mask mainly containing carbon by a CVD method on a body to be processed;

forming a silicon-containing resist underlayer film on the hard mask by using the composition for forming a silicon-containing resist underlayer film according to claim 1;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching while using the resist upper layer film having the formed circuit pattern as a mask;

transferring the pattern to the hard mask by dry etching while using the silicon-containing resist underlayer film having the transferred pattern as a mask; and transferring the pattern to the body to be processed by dry etching while using the hard mask having the transferred pattern as a mask.

12. A patterning process for forming a pattern in a body to be processed, comprising steps of:

forming a hard mask mainly containing carbon by a CVD method on a body to be processed;

forming a silicon-containing resist underlayer film on the hard mask by using the composition for forming a silicon-containing resist underlayer film according to claim 2;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching while using the resist upper layer film having the formed circuit pattern as a mask;

transferring the pattern to the hard mask by dry etching while using the silicon-containing resist underlayer film having the transferred pattern as a mask; and transferring the pattern to the body to be processed by dry etching while using the hard mask having the transferred pattern as a mask.

13. A patterning process for forming a pattern in a body to be processed, comprising steps of:

forming a hard mask mainly containing carbon by a CVD method on a body to be processed;

forming a silicon-containing resist underlayer film on the hard mask by using the composition for forming a silicon-containing resist underlayer film according to claim 3;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching while using the resist upper layer film having the formed circuit pattern as a mask;

transferring the pattern to the hard mask by dry etching while using the silicon-containing resist underlayer film having the transferred pattern as a mask; and transferring the pattern to the body to be processed by dry etching while using the hard mask having the transferred pattern as a mask.

14. A patterning process for forming a pattern in a body to be processed, comprising steps of:

forming a hard mask mainly containing carbon by a CVD method on a body to be processed;

forming a silicon-containing resist underlayer film on the hard mask by using the composition for forming a silicon-containing resist underlayer film according to claim 4;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching while using the resist upper layer film having the formed circuit pattern as a mask;

transferring the pattern to the hard mask by dry etching while using the silicon-containing resist underlayer film having the transferred pattern as a mask; and transferring the pattern to the body to be processed by dry etching while using the hard mask having the transferred pattern as a mask.

15. The patterning process according to claim 7, wherein in the step of forming the circuit pattern in the resist upper layer film, the pattern is formed by a photolithography with a wavelength of 10 nm or more and 300 nm or less, a direct drawing with electron beam, nanoimprinting, or a combination thereof.

16. The patterning process according to claim 11, wherein in the step of forming the circuit pattern in the resist upper layer film, the pattern is formed by a photolithography with a wavelength of 10 nm or more and 300 nm or less, a direct drawing with electron beam, nanoimprinting, or a combination thereof.

17. The patterning process according to claim 7, wherein the body to be processed is a semiconductor device substrate, a metal film, a metal carbide film, a metal oxide film, a metal nitride film, a metal oxycarbide film, or a metal oxynitride film.

18. The patterning process according to claim 11, wherein the body to be processed is a semiconductor device substrate, a metal film, a metal carbide film, a metal oxide film, a metal nitride film, a metal oxycarbide film, or a metal oxynitride film.

19. The patterning process according to claim 7, wherein the body to be processed comprises a metal which is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

20. The patterning process according to claim 11, wherein the body to be processed comprises a metal which is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

* * * * *